United States Patent
Mizuhara et al.

(10) Patent No.: US 6,235,648 B1
(45) Date of Patent: May 22, 2001

(54) SEMICONDUCTOR DEVICE INCLUDING INSULATION FILM AND FABRICATION METHOD THEREOF

(75) Inventors: Hideki Mizuhara; Hiroyuki Watanabe, both of Bisai; Naoteru Matsubara, Anpachi-gun, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/160,044

(22) Filed: Sep. 25, 1998

(30) Foreign Application Priority Data

Sep. 26, 1997 (JP) .................................................. 9-262170
Aug. 28, 1998 (JP) ................................................ 10-243893

(51) Int. Cl.⁷ ................................................ H01L 21/461
(52) U.S. Cl. ...................... 438/783; 438/618; 438/637; 438/653; 438/667; 438/720; 438/766
(58) Field of Search ..................... 438/783, 618, 438/637, 653, 669, 766, 720, 301, 305, 586, 595, 981; 257/324, 340, 389

(56) References Cited

U.S. PATENT DOCUMENTS

| | | | |
|---|---|---|---|
| 3,747,203 | 7/1973 | Shannon | 438/629 |
| 4,676,867 | 6/1987 | Elkins et al. | 156/643 |
| 4,775,550 | 10/1988 | Chu et al. | 427/38 |
| 4,885,262 | 12/1989 | Ting et al. | 437/231 |
| 4,962,052 | * 10/1990 | Asayama et al. | 437/31 |
| 4,983,546 | 1/1991 | Hyun et al. | 437/231 |
| 4,984,055 | 1/1991 | Okumura et al. | 257/644 |
| 5,003,062 | 3/1991 | Yen | 437/231 |
| 5,024,723 | 6/1991 | Goesele et. al. | 156/628 |
| 5,087,589 | 2/1992 | Chapman et al. | 437/195 |
| 5,106,787 | 4/1992 | Yen | 437/231 |
| 5,153,680 | 10/1992 | Naito et al. | 438/687 |

(List continued on next page.)

FOREIGN PATENT DOCUMENTS

| | | |
|---|---|---|
| 58-31519 | 2/1983 | (JP) . |
| 59-17243 | 1/1984 | (JP) . |
| 62-60242 | 3/1987 | (JP) . |
| 1-199456 | 8/1989 | (JP) . |
| 2-26055 | 1/1990 | (JP) . |
| 2-7451 | 1/1990 | (JP) . |
| 8-241891 | 9/1996 | (JP) . |
| 9-69562 | 3/1997 | (JP) . |
| 9-330982 | 12/1997 | (JP) . |
| 10-209147 | 8/1998 | (JP) . |
| 10-303295 | 11/1998 | (JP) . |

(List continued on next page.)

OTHER PUBLICATIONS

1995 Proceedings 12th International VLSI Multilevel Interconnection Conference (VMIC Catalog No. 951SMIC—104)–Jun. 27–29, 1995.

Moriya et al., "Modification Effects in Ion–Implanted SiO₂ Spin–on–Glass," *J. Electrochem, Soc.*, vol. 140, No. 5, May 1993, pp. 1442–1450.

(List continued on next page.)

*Primary Examiner*—David Nelms
*Assistant Examiner*—Reneé R. Berry
(74) *Attorney, Agent, or Firm*—Armstrong, Westerman, Hattori, McLeland & Naughton

(57) ABSTRACT

A semiconductor device including an insulation film superior in insulation characteristic is obtained. Boron ions are introduced by ion implantation into an organic SOG film with a silicon nitride film formed on the organic SOG film. By this boron implantation, the property of the organic SOG film is modified. The moisture and hydroxyl group included in the film are greatly reduced irrespective of the amount of dose of ions. By using such a layered film of a modified SOG film and a silicon nitride film thereupon as an interlayer insulation film or a passivation film, the water resistance of a semiconductor device can be improved sufficiently.

15 Claims, 20 Drawing Sheets

U.S. PATENT DOCUMENTS

| | | | |
|---|---|---|---|
| 5,166,768 | 11/1992 | Ito | 438/637 |
| 5,186,745 | 2/1993 | Maniar | 106/287 |
| 5,192,697 | 3/1993 | Leong | 437/37 |
| 5,270,259 | 12/1993 | Ito et al. | 437/235 |
| 5,314,834 * | 5/1994 | Mazure et al. | 438/595 |
| 5,341,026 | 8/1994 | Harada et al. | 257/764 |
| 5,352,630 | 10/1994 | Kim et al. | 437/195 |
| 5,404,046 | 4/1995 | Matsumoto et al. | 257/750 |
| 5,429,990 | 7/1995 | Liu et al. | 437/190 |
| 5,468,684 | 11/1995 | Yoshimori et al. | 437/228 |
| 5,496,776 | 3/1996 | Chien et al. | 437/231 |
| 5,514,910 | 5/1996 | Koyama | 257/768 |
| 5,549,786 | 8/1996 | Jones et al. | 156/662.1 |
| 5,569,618 | 10/1996 | Matsubara | 437/52 |
| 5,607,880 | 3/1997 | Suzuki | 437/195 |
| 5,616,513 | 4/1997 | Shepard | 438/402 |
| 5,665,845 | 9/1997 | Allman | 528/8 |
| 5,674,784 | 10/1997 | Jang, et al. | 437/195 |
| 5,702,568 | 12/1997 | Shin et al. | 156/644 |
| 5,723,895 | 3/1998 | Takashashi | 257/499 |
| 5,786,273 | 7/1998 | Hibi et al. | 438/637 |
| 5,817,582 | 10/1998 | Maniar | 438/782 |
| 5,830,773 | 11/1998 | Brennan et al. | 437/67 |
| 5,855,962 | 1/1999 | Cote et al. | 427/376 |
| 5,892,269 | 4/1999 | Inoue, et al. | 257/634 |
| 5,898,221 | 4/1999 | Mizuhara et al. | 257/751 |
| 5,930,624 * | 7/1999 | Murata et al. | 438/253 |
| 5,963,827 | 10/1999 | Enomoto et al. | 438/629 |
| 6,013,578 | 1/2000 | Jun | 438/687 |
| 6,071,807 | 6/2000 | Watsnabe et al. | 438/623 |

FOREIGN PATENT DOCUMENTS

| | | |
|---|---|---|
| 2-235358 | 9/1990 | (JP) . |
| 2-253643 | 10/1990 | (JP) . |
| 3-101130 | 4/1991 | (JP) . |
| 4-234149 | 8/1992 | (JP) . |
| 4-317358 | 11/1992 | (JP) . |
| 5-226334 | 3/1993 | (JP) . |
| 5-74963 | 3/1993 | (JP) . |
| 5-198523 | 8/1993 | (JP) . |
| 5-226334 | 9/1993 | (JP) . |
| 6-275229 | 9/1994 | (JP) . |
| 6-349950 | 12/1994 | (JP) . |
| 7-99195 | 4/1995 | (JP) . |
| 8-17770 | 1/1996 | (JP) . |
| 8-64561 | 3/1996 | (JP) . |

OTHER PUBLICATIONS

Ishida et al., "Mechanism for ALSiCu alloy Corrosion," *Jpn. J. Appl. Phys.*, vol. 31 (1992), pp. 2045–2048.

"Multilevel–Interconnection Technology for VLSI and ULSI," Silicon Processing for the VLSI Era–Volume II, (pp. 232–233).

"Lithography I: Optical Resist Material and Process Technology, "(p. 441).

* cited by examiner

SEMICONDUCTOR DEVICE INCLUDING INSULATION FILM AND FABRICATION METHOD THEREOF

BACKGROUND OF THE INVENTION

1. Field of the Invention

The present invention relates to a semiconductor device including an insulation film and a fabrication method thereof. More particularly, the present invention relates to a semiconductor device including an insulation film such as an interlayer insulation film or a passivation film superior in water resistance, and a method of fabrication thereof.

2. Description of the Background Art

In the past few years, intensive efforts have been taken to reduce the size of interconnections and provide multilayers for the purpose of further increasing the integration density of semiconductor integrated circuit devices. An interlayer insulation film is provided between each interconnection to obtain a multilayer structure of the interconnection. If the surface of this interlayer insulation film is not planar, a step-graded portion will be generated at the interconnection formed above the interlayer insulation film. This will cause defects such as disconnection. Therefore, the surface of the interlayer insulation film (the surface of the device) must be made as flat as possible. The technique to planarize the surface of the device is called planarization. This planarization technique has become important in reducing the size and providing multilayers of the interconnection.

In planarization, an SOG (Spin On Glass) film is known as an interlayer insulation film that is generally used. Recently, development in the planarization technique taking advantage of the fluidity of a material of the interlayer insulation film is particularly noticeable.

An "SOG" is a generic term of a film mainly composed of a solution in which a silicon compound is dissolved in an organic solvent, and silicon dioxide formed from that solution.

In forming an SOG film, first a solution having a silicon compound dissolved in an organic solvent is applied in droplets on a rotated substrate. By this rotation, the solution coating is provided so as to alleviate the step-graded portion on the substrate corresponding to the interconnection. More specifically, the coating is formed thick at the concave portion and thin at the convex portion on the substrate. As a result, the surface of the solution coating is planarized.

Then, heat treatment is applied to vaporize the organic solvent. Also, polymerization proceeds to result in a planarized SOG film at the surface.

An SOG film is typically classified into an inorganic SOG film that does not include any organic component in a silicon compound, as represented by the following general formula (1), and an organic SOG film including an organic component in a silicon compound, as represented by the following general formula (2).

$[SiO_2]n$ (1)

$[R_xSi_yO_z]n$ (2)

(n, X, Y, Z: integer; R: alkyl group or aryl group)

An inorganic SOG film includes a great amount of moisture and hydroxyl group. It is more brittle than a silicon oxide film formed by CVD (Chemical Vapor Deposition). There was a disadvantage that a crack is easily generated during the heat treatment when the thickness of the inorganic SOG film is greater than 0.5 μm.

In contrast, an organic SOG film does not have any cracks generated during the heat treatment, and the film thickness can be set to approximately 0.5–1 μm. Therefore, the usage of an organic SOG film allows the formation of a thicker interlayer insulation film. This means that sufficient planarization can be achieved even for a great step-graded portion on a substrate.

As described above, inorganic and organic SOG films have superior planarization. However, the great amount of moisture and hydroxyl group included in an inorganic SOG film will adversely affect the metal interconnection and the like to induce the problem of degrading the electrical characteristics and the action of corrosion.

A similar problem is seen in an organic SOG film. This is because, though smaller in comparison to an inorganic SOG film, the organic SOG film includes some amount of moisture and hydroxyl group.

To compensate for this disadvantage when an SOG film is employed as an interlayer insulation film, an insulation film such as a silicon oxide film formed by, for example, plasma CVD, having the characteristics of insulation and mechanical strength in addition to the property of blocking moisture and hydroxyl group is provided above or beneath the SOG film. Such a structure is disclosed in, for example, Japanese Patent Laying-Open No. 5-226334.

SUMMARY OF THE INVENTION

An object of the present invention is to provide a semiconductor device that has sufficient water resistance.

Another object of the present invention is to provide a semiconductor device that allows the adhesion intensity between an upper insulation film and a lower insulation film to be improved.

A further object of the present invention is to provide a semiconductor device that can have interconnection resistance reduced of a metal interconnection layer located below an insulation film.

According to an aspect of the present invention, a method of fabricating semiconductor device includes the steps of forming a first insulation film on a substrate, forming a cap film on the first insulation film having water resistance better than that of the first insulation film, and introducing impurities into the first insulation film.

By introducing impurities such as by ion-implantation into the first insulation film, the film property of the first insulation film is improved to reduce the moisture and hydroxyl group included in the film. Also, the first insulation film having impurities introduced will be superior in hygroscopic resistance. By forming a cap film on the first insulation film having water resistance favorable than that of the first insulation film, the containing rate of moisture and hydroxyl group in the first insulation film is reduced.

Introduction of impurities into the first insulation film can be carried out through a cap that is formed. Introduction through the cap film allows the containing rate of the moisture and hydroxyl group in the first insulation film to be reduced significantly. The cap film can be formed after introducing impurities into the first insulation film. By applying a heat treatment after introducing the impurities, the moisture remaining in the insulation film can be removed promptly.

The substrate is typically a semiconductor substrate such as of single crystal silicon. However, the substrate may be an insulation substrate such as a glass substrate. The first insulation film includes a planarized insulation film that is subjected to, for example, a planar process. As one example, the first insulation film includes a silicon oxide film containing at least 1% of carbon atoms. As another example, the first insulation film includes an inorganic SOG film. The impurities introduced into the first insulation film are preferably boron ions or argon ions. The cap film preferably includes a silicon nitride type material. As one example, the cap film includes a nitride film that is the first insulation film nitrided. As another example, the cap film may be a metal film.

According to another aspect of the present invention, a method of fabricating a semiconductor device includes the step of forming a lower insulation film on a substrate prior to formation of a first insulation film. Introduction of impurities into the first insulation film is carried out under the condition that the introduced impurities arrive at the interface between the first insulation film and the lower insulation film. Such introduction of impurities under this condition allows greater adhesion to be obtained between the first insulation film and the lower insulation film. Particularly, by introducing impurities under the condition where the number of impurities per unit area passing through the bottom plane of the first insulation film is at least $2 \times 10^{13}$ atoms/cm$^2$, superior adhesion intensity can be obtained. The upper limit of the number of impurities passing through the bottom plane of the first insulation film per unit area is preferably $2 \times 10^{18}$ atoms/cm$^2$.

According to a further aspect of the present invention, a method of fabricating a semiconductor device includes the step of forming a metal interconnection layer on a substrate prior to formation of a first insulation film. Introduction of impurities into the first insulation film is carried out under the condition that the introduced impurities reach the metal interconnection layer. By introducing impurities such as boron into the metal interconnection layer, the interconnection resistance is reduced. As a result, the thickness of the interconnection member can be made thinner. Boron ions have a relatively small mass. Therefore, when implanted under the same implantation energy, boron ions will be implanted deeper than those of greater mass. Therefore, the effect of modifying the property of the insulation film can be improved.

According to still another aspect of the present invention, a method of fabricating a semiconductor device includes the steps of forming a metal interconnection layer on a substrate, and forming a lower insulation film on the metal interconnection layer, prior to formation of a first insulation film. Introduction of impurities into the first insulation film is carried out under the condition of the introduced impurities reaching the metal interconnection layer.

By using a layered film of a first insulation film and a cap film, or a layered film of a lower insulation film, a first insulation film, and a cap film as a interlayer insulation film or a passivation film, the water resistance of the semiconductor device can be improved significantly.

The semiconductor device of the present invention includes a substrate, a first insulation film located on the substrate, a cap film covering the first insulation film, and having water resistance favorable than that of the first insulation film, and impurities distributed in the first insulation film and in the cap film.

The cap film preferably includes a silicon nitride type material. As one example, the cap film includes a nitride film that is the first insulation film nitrided. As another example, the cap film may be a metal film.

The first insulation film preferably includes a planarization insulation film that is subjected to a planarization process. As one example, the first insulation film includes a silicon oxide film containing at least 1% of carbon atoms. As another example, the first insulation film includes an inorganic SOG film.

The impurities are preferably either boron or argon ions. The number of impurities introduced into the first insulation film is preferably at least $2 \times 10^{13}$ atoms/cm$^2$.

According to a still further aspect of the present invention, a semiconductor device includes a lower insulation film below the first insulation film. The impurities are also introduced into the lower insulation film. The profile of the impurities is continuous with the lower insulation film and the first insulation film. The number of impurities introduced into the first insulation film is preferably at least $2 \times 10^{13}$ atoms/cm$^2$.

According to yet a further aspect of the present invention, a semiconductor device includes a metal interconnection layer below the first insulation film. Impurities are introduced also into the metal interconnection layer. The metal interconnection layer preferably includes a titanium film to which impurities are introduced.

According to the semiconductor device of the present invention, the film property is improved by introducing impurities into the first insulation film. The moisture and hydroxyl group in the film are reduced to improve the hygroscopic resistance. Since the cap film located on the first insulation film includes impurities and has water resistance superior than that of the first insulation film, the containing rate of the moisture and hydroxyl group in the first insulation film is further reduced.

The impurities introduced so as to pass through the bottom plane of the first insulation film do not have to pass through the entire bottom plane of the first insulation film. The introduced impurities have to pass through only at least a portion of the bottom plane of the first insulation film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

A fabrication process (first step–eighth step) of a semiconductor device according to a first embodiment of the present invention will be described hereinafter with reference to FIGS. 1–8.

Figure 1:
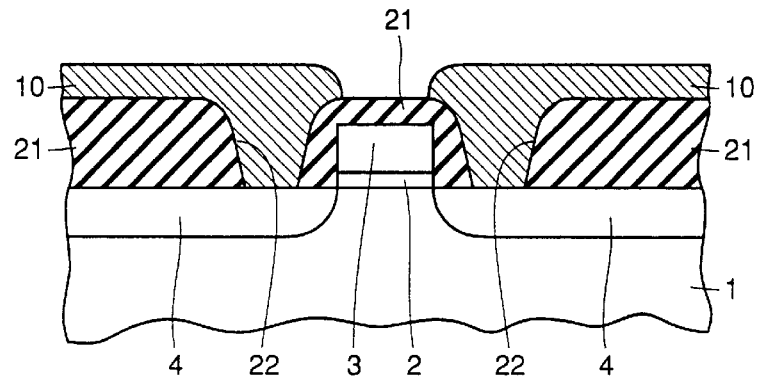
FIGS. 1–8 are sectional views of a semiconductor device for describing a fabrication process according to a first embodiment of the present invention.

At the first step shown in FIG. 1, a gate oxide film 2 is formed approximately 10 nm in thickness on a (100) p type (or n type) single crystal silicon substrate 1. A gate electrode 3 is formed approximately 200 nm in thickness on gate oxide film 2. Using gate oxide film 2 and gate electrode 3 as a mask, n type (or p type) impurities are doped into single crystal silicon substrate 1 by ion-implantation. As a result, a source.drain region 4 is formed in self-alignment. Thus, a MOS transistor is completed.

Following formation of a silicon oxide film 21 by CVD all over the device, a contact hole 22 is formed at a region of silicon oxide film 21 located above source.drain region 4.

Then, an aluminum alloy film (Al—Si (1%)—Cu (0.5%)) is deposited all over the device including the inside of contact hole 22 by sputtering. Anisotropic etching is carried out so that a desired pattern of the aluminum alloy film is obtained to form a source.drain electrode (source.drain interconnection) 10.

Figure 2:
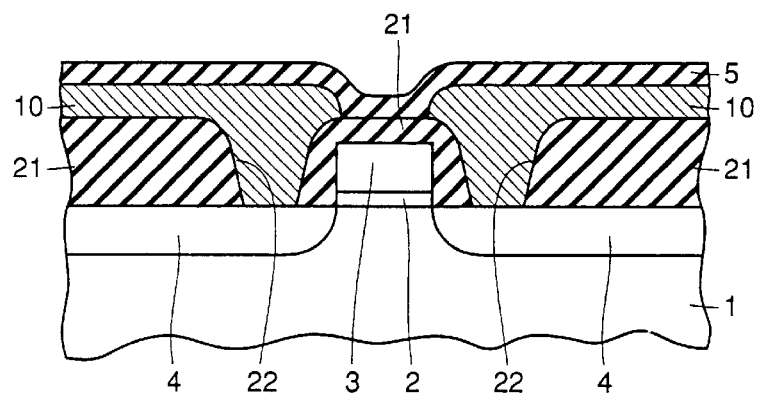

At the second step shown in FIG. 2, a silicon oxide film 5 of approximately 200 nm in thickness is formed all over the device by plasma CVD. The gas used in this plasma CVD includes monosilane and nitrous oxide ($SiH_4+N_2O$), monosilane and oxygen ($SiH_4+O_2$), TEOS (Tetra-ethoxy-silane) and oxygen ($TEOS+O_2$), TRIES (Tri-ethoxy-silane) and nitrous oxide ($N_2O$), and the like. The temperature of film growth is 300–900° C.

Figure 3:
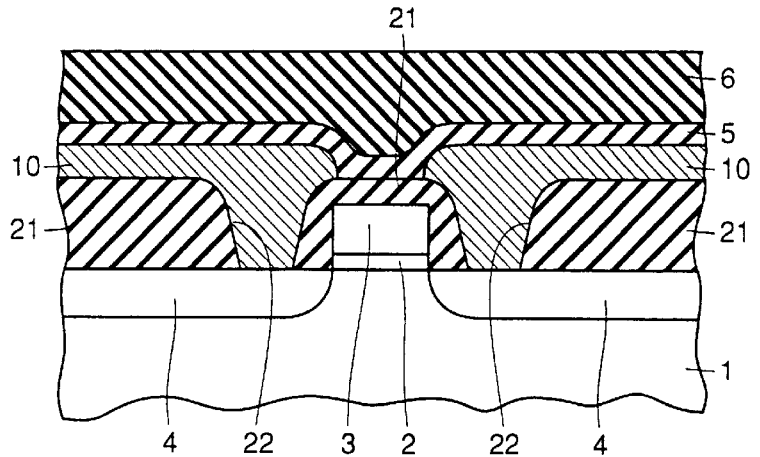

At the third step shown in FIG. 3, an organic SOG film 6 is formed on silicon oxide film 5. Organic SOG film 6 has a composition of $[(CH_3)_2Si_4O_7]_n$, and a film thickness of approximately 600 nm. Organic SOG film 6 is formed as set forth in the following. First, an alcohol based solution of a silicon compound of the above composition (for example, IPA+acetone) is applied on single crystal silicon substrate 1 in droplets while rotating single crystal silicon plate 1 for 20 seconds at the rotational speed of 2300 rpm. Thus, a coating of the alcohol based solution is provided on single crystal silicon substrate 1. Here, the alcohol based solution coating is formed thick at the concave portion and thin at the convex portion with respect to the step-graded portion on single crystal silicon substrate 1 to alleviate the unevenness. As a result, the surface of the alcohol based solution coating is planarized.

Then, heat treatment of 100° C. for 1 minute, 200° C. for 1 minute, 300° C. for 1 minute, 22° C. for 1 minute, and 430° C. for 30 minutes are sequentially carried out in an atmosphere of nitrogen, whereby the alcohol based solution is vaporized and polymerization proceeds. As a result, an organic SOG film of approximately 300 nm in thickness with a planar surface is formed. By repeating one more time this process of coating to heat treatment, an organic SOG film 6 of approximately 600 nm in thickness is obtained. This organic SOG film 6 is a silicon oxide film including at least 1% of carbon.

Figure 4:
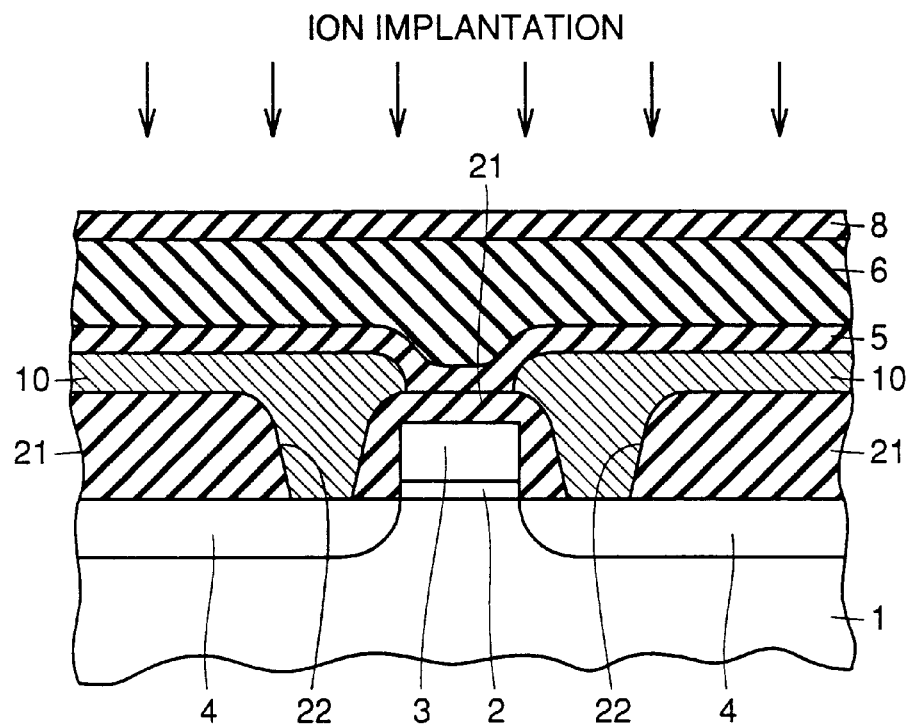

At the fourth step of FIG. 4, a silicon nitride film 8 of approximately 50 nm in thickness is formed on organic SOG film 6 by plasma CVD. The gas used in the plasma CVD is monosilane and ammonia ($SiH_4+NH_3$), monosilane and hydrazine ($N_2H_4$), and the like. The film growth temperature is 300–400° C. Silicon nitride film 8 has an insulation effect of a level similar to that of silicon oxide film 5 at a smaller film thickness. Therefore, the total film thickness can be reduced as the interlayer insulation film.

Then, by ion implantation, boron ions ($B^+$) are doped through a silicon nitride film 8 into organic SOG film 6 under the conditions of an acceleration energy of 140 KeV and dosage of $2\times10^{15}$ atoms/$cm^2$. The condition is set so that the number of boron ions passing through the interface of organic SOG film 6 and silicon oxide film 5 per unit area is at least $2\times10^{13}$ atoms/$cm^2$ and not more than $2\times10^{18}$ atoms/$cm^2$.

By implanting ions into organic SOG film 6, the organic component in organic SOG film 6 is decomposed. Also, the moisture and hydroxyl group included in the film are reduced. By implanting boron ions at a level so that the ions pass through the interface of organic SOG film 6 and silicon oxide film 5, the adhesion intensity between organic SOG film 6 and silicon oxide film 5 can be improved.

As a result, the organic SOG film is modified into an SOG film 7 (referred to as "modified SOG film" hereinafter) with no organic component and with little moisture or hydroxyl group, and having high adhesion with the insulation film 5. Boron ions are introduced into silicon nitride film 8 when the boron ions are introduced into the organic SOG film through silicon nitride film 8.

Figure 5:
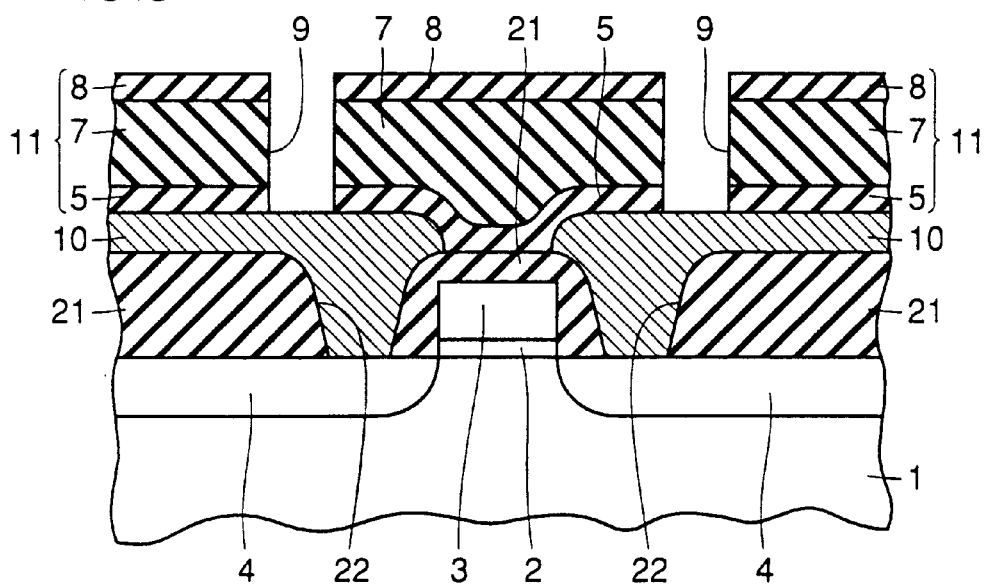

At the fifth step of FIG. 5, anisotropic etching is carried out using a mixture gas of tetra carbon fluoride and hydrogen as etching gas to form a via hole 9 in silicon oxide film 5, modified SOG film 7 and silicon nitride film 8 on source-drain region 4.

Figure 6:
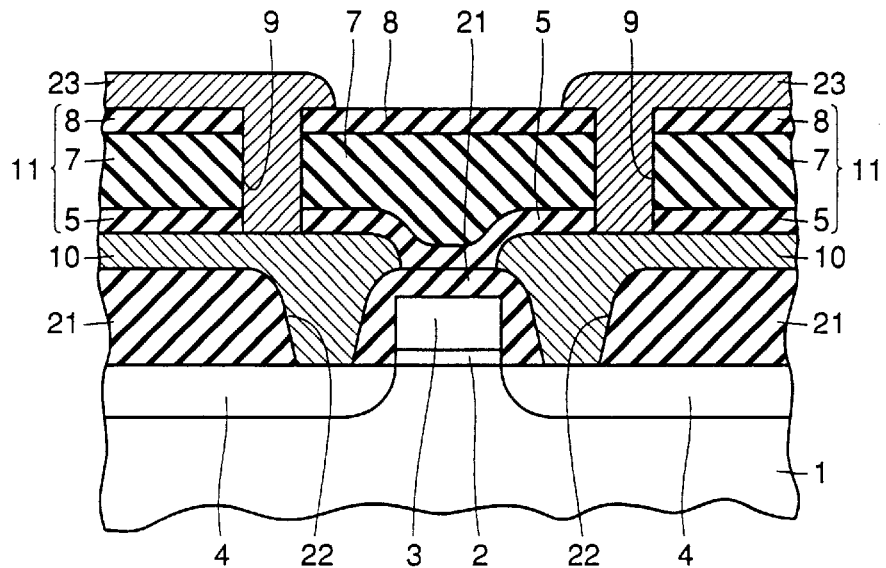

At the sixth step of FIG. 6, the interior of via hole 9 is cleaned by sputter etching using inert gas (for example, Ar). Then, magnetron sputtering is applied to sequentially form an Al alloy film (Al—Si (1%)—Cu (0.5%)) of 500 nm in film thickness, a Ti film of 50 nm in film thickness, and a TiN film of 20 nm in film thickness in this order in via hole 9 and on silicon nitride film 8.

Resist (not shown) coating, exposure, and etching processes are carried out in accordance with the general lithographic and dry etching technologies (RIE and the like) to pattern the aluminum alloy film, Ti film and TiN film to a predetermined configuration. Thus, an upper layer metal interconnection 23 is formed.

Figure 7:
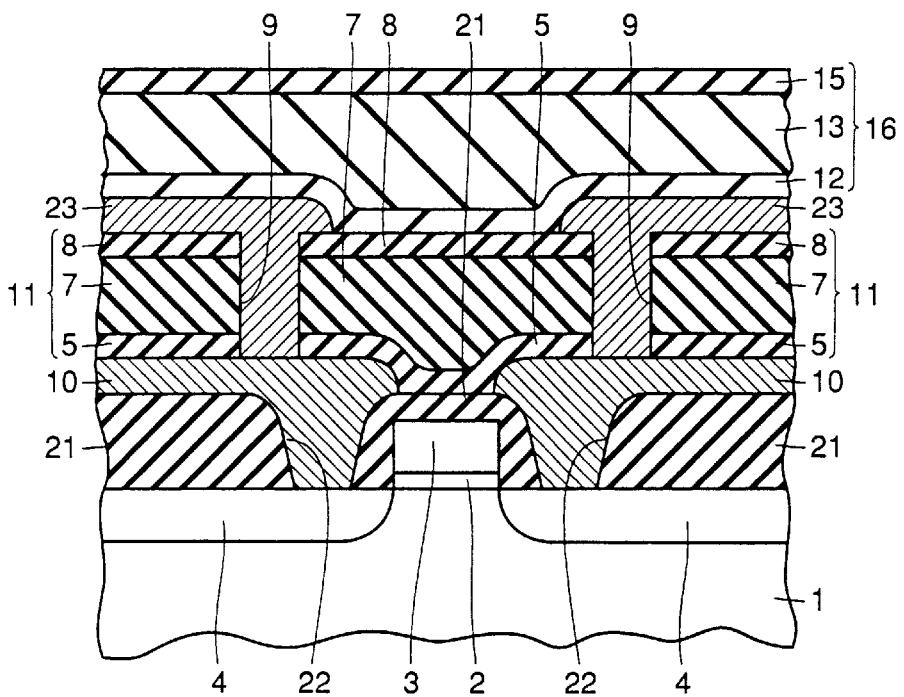

The seventh step will be described with reference to FIG. 7. In the seventh step, a silicon oxide film 12 of approximately 200 nm in film thickness is formed all over the device. Then, an organic SOG film 13 of approximately 600 nm in thickness is formed on silicon oxide film 12. A silicon nitride film 15 of approximately 50 nm in film thickness is also formed thereon. The method of forming silicon oxide film 12, organic SOG film 13, and silicon nitride film 15 is similar to that of silicon oxide film 5, organic SOG film 6, and silicon nitride film 8 described previously.

Figure 8:
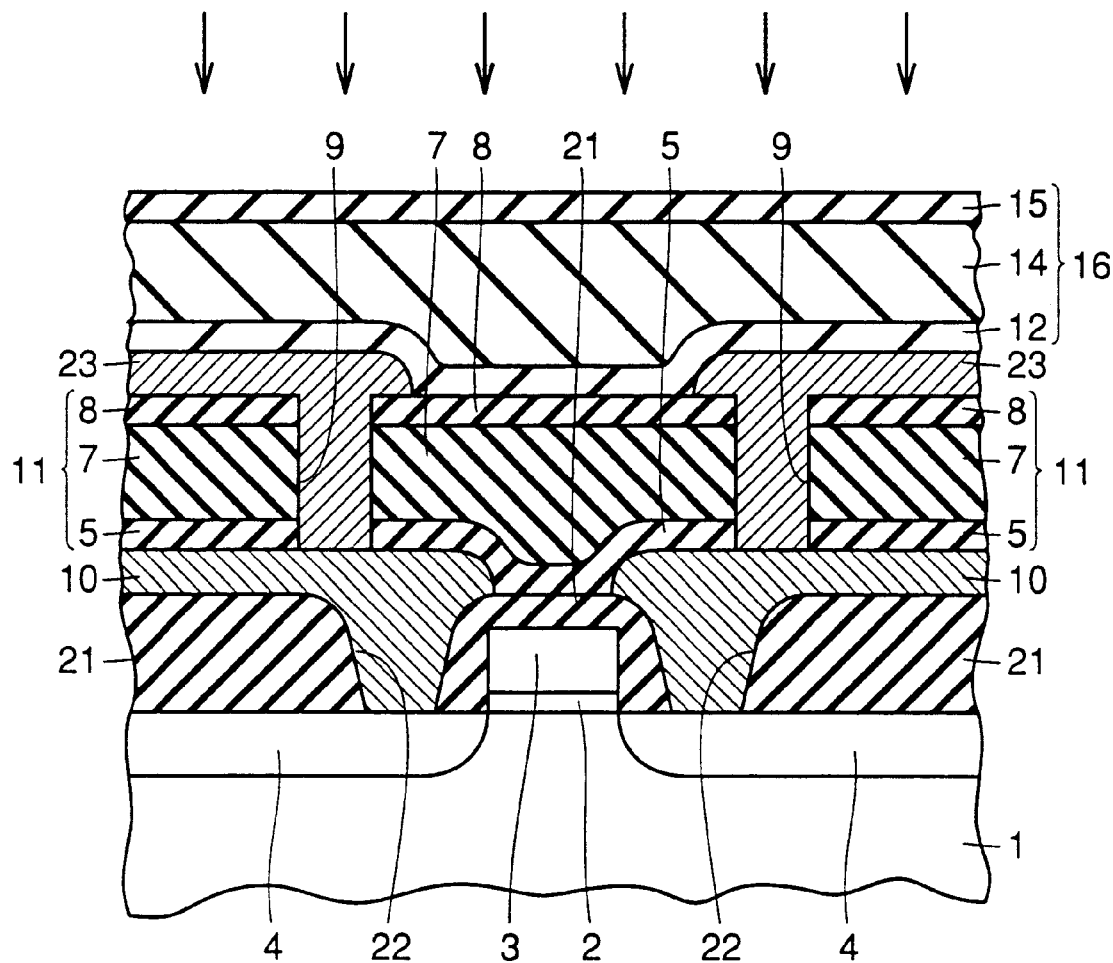

At the eighth step of FIG. 8, boron ions are implanted into organic SOG film 13 through silicon nitride film 15 to obtain a modified SOG film 14 (film thickness 600 nm). The ion implantation condition is identical to that of the fourth step. Therefore, the number of boron ions per unit area passing through the interface of organic SOG film 13 and silicon oxide film 12 is at least $2\times10^{13}$ atoms/$cm^2$. As a result, organic SOG film 13 is converted into modified SOG film 14 of high adhesion with the insulation film and of almost no moisture and hydroxyl group. By the layered structure of silicon oxide film, modified SOG film 14 and silicon nitride film 15, a passivation film 16 to provide insulation protection for the device is formed.

By sandwiching modified SOG film 14 between silicon oxide film 12 and silicon nitride film 15 in the present embodiments, the insulation and mechanical strength can be improved for the entire passivation film 16. The presence of silicon oxide film 12 particularly provides the advantage of improving the insulation effect of passivation film 16. Furthermore, the adhesion for the entire passivation film is improved since silicon oxide film 12 is more adhesive to an interconnection layer than modified SOG film 14. In addition, the presence of silicon nitride film 15 further improves the moisture resistance of passivation film 16. It is to be noted that silicon oxide film 12 can be omitted appropriately since modified SOG film 14 includes no organic component and has only a slight amount of moisture and hydroxyl group.

According to the first embodiment of the present invention, an interlayer insulation film 11 of a 3-layered structure of silicon oxide film 5, modified SOG film 7 and silicon nitride film 8 is formed on a MOS transistor. The presence of modified SOG film 7 allows a thicker interlayer insulation film 11 to be formed. As a result, sufficient planarization can be achieved even for a great step-graded portion on single crystal silicon substrate 1. Also, since the step coverage of modified SOG films 7 and 14 per se is superior, they can be easily filled between the interconnections even when the distance between the interconnections is small. Furthermore, the superior planarization of modified SOG films 7 and 14 allows silicon nitride films 8 and 15 to be applied easily thereon.

A sandwich structure of modified SOG film 7 between silicon oxide film 5 and silicon nitride film 8 is employed for the purpose of further improving the insulation and mechanical strength characteristics for the entire interlayer insulation film 11.

According to the first embodiment of the present invention, modified SOG films 7 and 14 do not easily peel away from silicon oxide films 5 and 12 since organic SOG films 6 and 13 are subjected to ion implantation so that impurities of at least a predetermined integrated intensity (number per unit area) passes through the interface with silicon oxide films 5 and 12 as described above.

Table 1 shows the verified results using a tensile tester of the adhesion intensity between an SOG film and a silicon oxide film in a test device (1) having an SOG film of 600 nm in film thickness formed on a silicon oxide film. Four types of SOG films were provided as in Table 1. Ten samples were provided for each type. The film peel off rate was determined by carrying out a tension test at the tensile force of 500 kg/cm$^2$ to observe how many of the samples exhibited peel off.

TABLE 1

| Condition | Film Peel Off Rate |
|---|---|
| Organic SOG Film | 100% |
| Low-pressure Oxygen Plasma Treatment | 100% |
| Modified SOG Film (Ar ion Implantation) | 0% |
| Modified SOG Film (B ion Implantation) | 0% |

The condition column in Table 1 corresponds to those used as an SOG film. The low-pressure oxygen plasma treatment implies that an organic SOG film is exposed to oxygen plasma. The modified SOG film is formed under the conditions identical to those of the present embodiment.

It is appreciated from Table 1 that, by employing a modified SOG film as the SOG film, the adhesion intensity with the underlying silicon oxide film is improved to prevent the film from peeling off.

Figure 9:
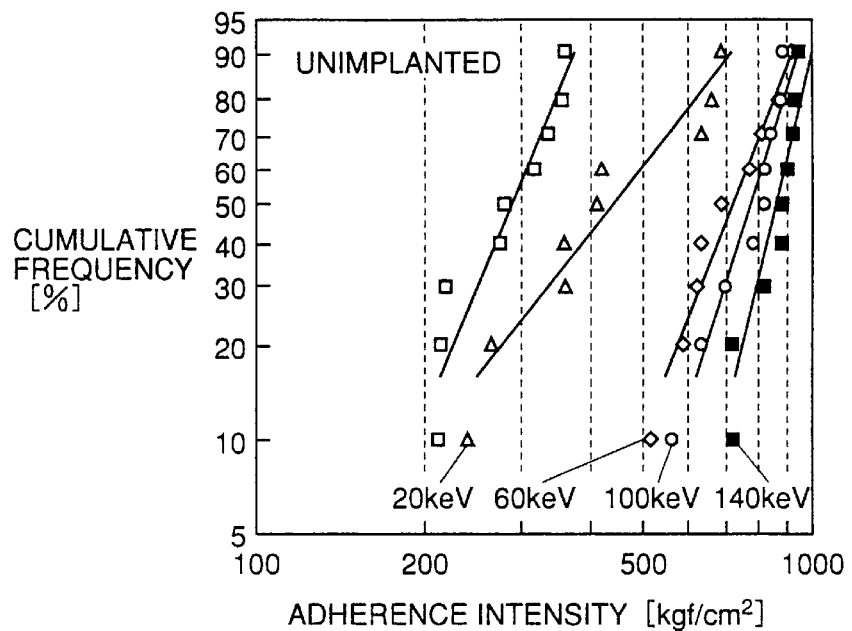
FIGS. 9–24 are diagrams of characteristics for describing an embodiment of the present invention.

FIG. 9 shows the adhesion intensity when boron ions (B$^+$) are implanted under different conditions to the SOG film in the test device (1) similar to that of the above Table 1. The dosage was set to a constant value of 1×10$^{15}$ atoms/cm$^2$, and the acceleration energy was varied to 20, 60, 100, and 140 KeV. The label "UNIMPLANTED" in the drawing implies that the film is not subjected to ion implantation, i.e. an organic SOG film.

It is appreciated that a film not subjected to ion implantation exhibits poor adhesion between the SOG film and the silicon oxide film. The film will easily peel off. In contrast, those subjected to ion implantation exhibit higher adhesion intensity as the acceleration energy becomes greater. Particularly with an acceleration energy of at least 60 KeV, an adhesion intensity greater than 700 Kgf/cm$^2$ can be achieved. This improvement in adhesion intensity is considered to be caused by ions arriving at the interface between the SOG film and the silicon oxide film to promote mixing and recombination of the elements at the interface.

Figure 10:
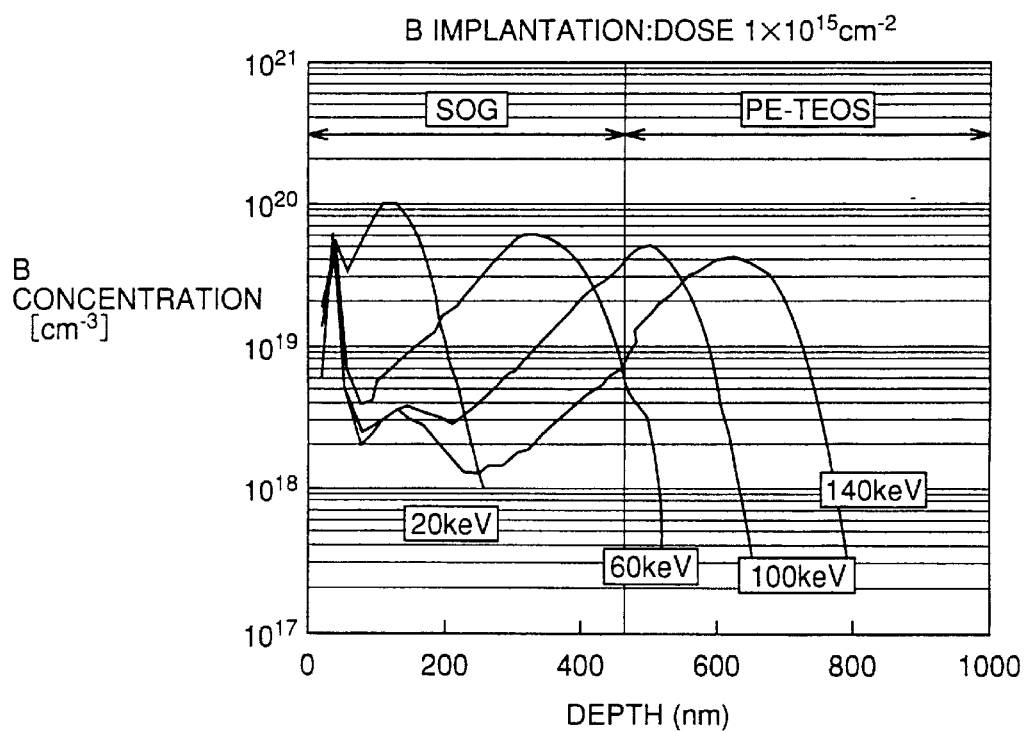
Figure 11:
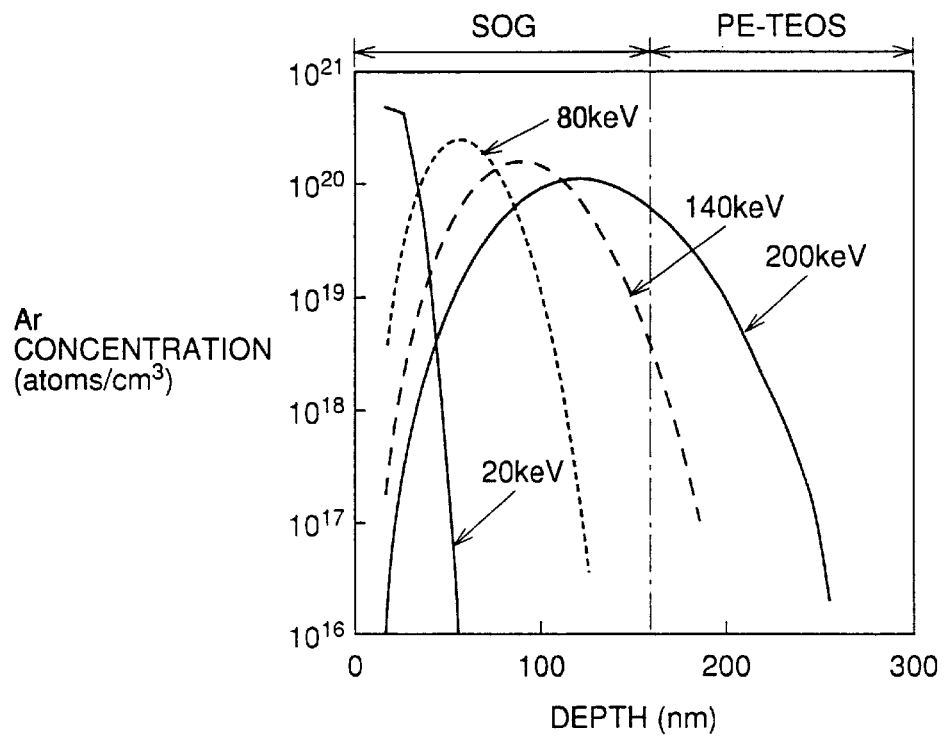

FIG. 10 shows the impurity profile of boron (B) in the SOG film and the underlying plasma enhanced TEOS oxide film (silicon oxide film). It is appreciated from FIG. 10 that the impurity concentration distribution of boron in the SOG film and that in the plasma TEOS oxide film (PE-TEOS) are continuous. This is because impurities are ion-implanted into the SOG film so that the boron ions pass through the interface of the SOG film and the underlying plasma TEOS oxide film. Similarly, when Ar ions are implanted, an impurity profile is formed continuously at the interface between the SOG film and the underlying plasma TEOS oxide film as shown in FIG. 11.

Figure 12:
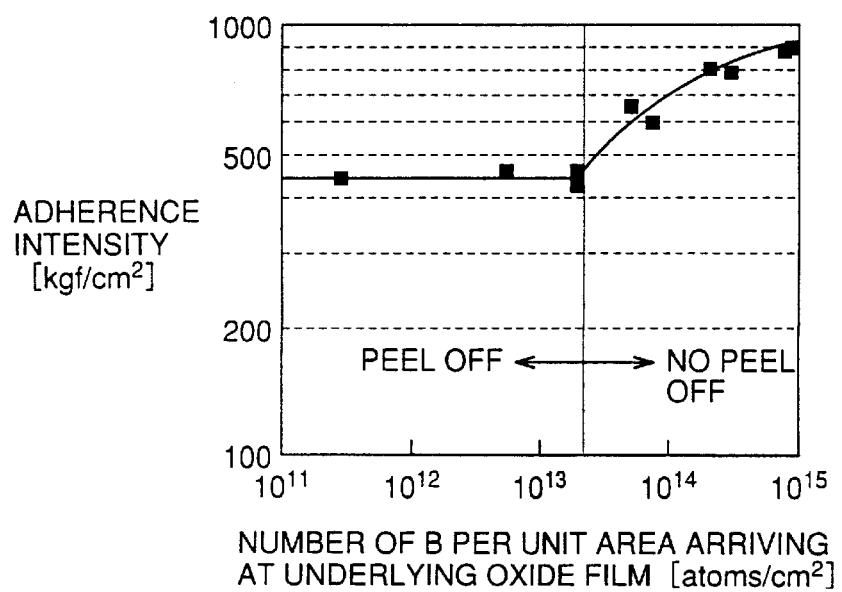

FIG. 12 shows the measured result of the relationship between the number of boron ions passing through the interface of the SOG film and the silicon oxide film per unit area and the adhesion intensity. It is appreciated from FIG. 12 that the adhesion between the SOG film and the silicon oxide film is suddenly increased to extremely reduce the generation rate of film peel off when the number of boron ions passing through the interface per unit area exceeds 2×10$^{13}$ atoms/cm$^2$. It is therefore preferable to set the number of boron ions passing through the SOG film and the silicon oxide film per unit area to at least 2×10$^{13}$ atoms/cm$^2$ for the purpose of effectively preventing the peel off of the SOG film from the silicon oxide film. When the number of boron ions passing through the interface per unit area exceeds 2×10$^{18}$ atoms/cm$^2$, the sputtering effect becomes so great that the surface will be removed. It is therefore preferable to set the number of boron ions passing through the interface per unit area to less than 2×10$^{18}$ atoms/cm$^2$.

In order to set the number of boron ions passing through the interface per unit area greater than 2×10$^{13}$ atoms/cm$^2$ in the above test device (1), an acceleration energy of at least 60 KeV with a dosage of 1×10$^{15}$ atoms/cm$^2$ is required.

Figure 13:
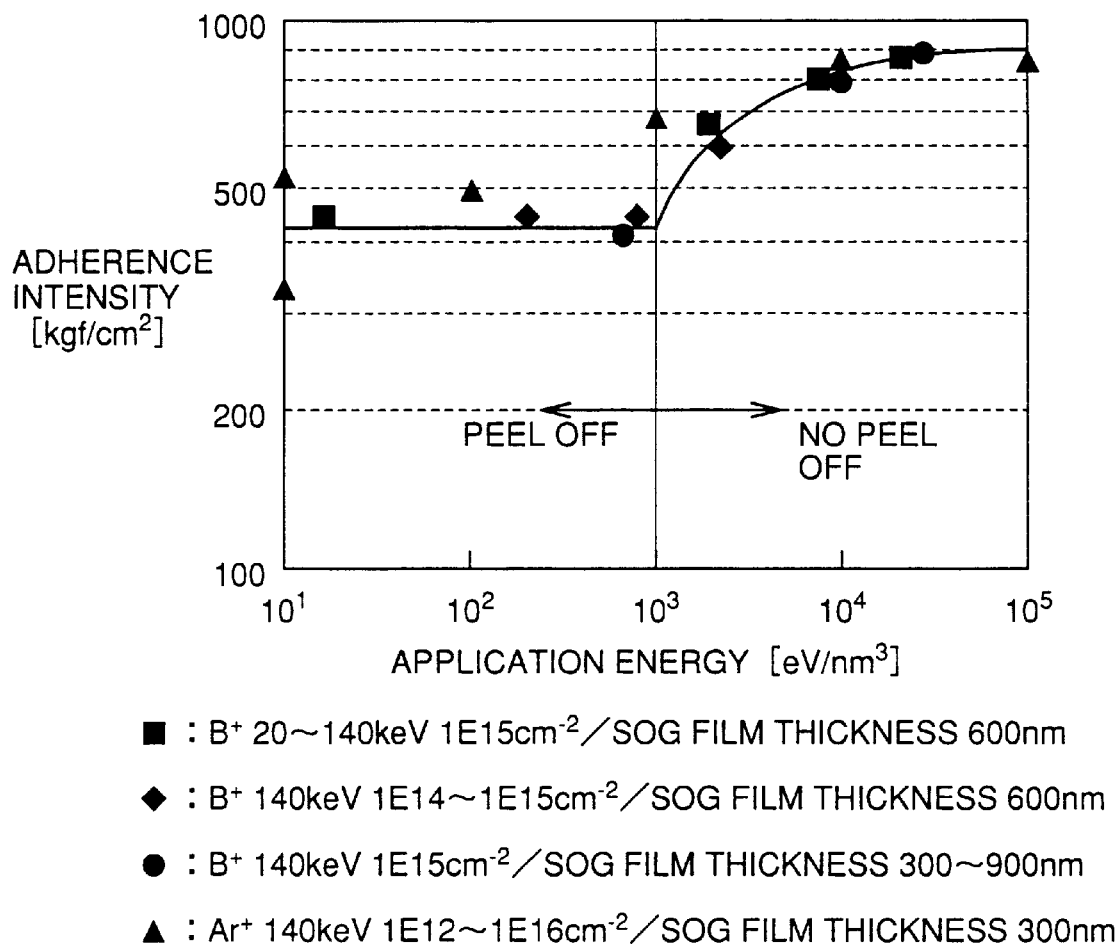

FIG. 13 shows the relationship between the application energy and adhesion with different values of the boron implantation energy, boron dosage, SOG film thickness at boron-implantation, and argon dosage. Here, "application energy" refers to the energy per unit volume applied to a region of the implanted depth of the ions. It is appreciated from FIG. 13 that the adhesion between the SOG film and the silicon oxide film is suddenly increased to result in an extremely low generation rate of the film peel off when the application energy becomes greater than 10$^3$ eV/nm$^3$. It is therefore preferable to set the application energy to at least 10$^3$ eV/nm$^3$ in order to effectively suppress the peel off of the SOG film from the silicon oxide film. It is also appreciated that the adhesion intensity can be improved even when argon (Ar) is implanted instead of boron (B) as shown in FIG. 13.

Furthermore, since modified SOG film 7 includes no organic component, the etching process to form via hole 9 can be carried out in an atmosphere of a mixture gas of tetra carbon fluoride and hydrogen. Therefore, the photoresist, if used as a etching mask in this etching process, will not be invaded by the etching gas. Therefore, modified SOG film 7 masked by the photoresist will not be etched. Thus, via hole 9 of a submicron configuration can be formed accurately.

Figure 14:
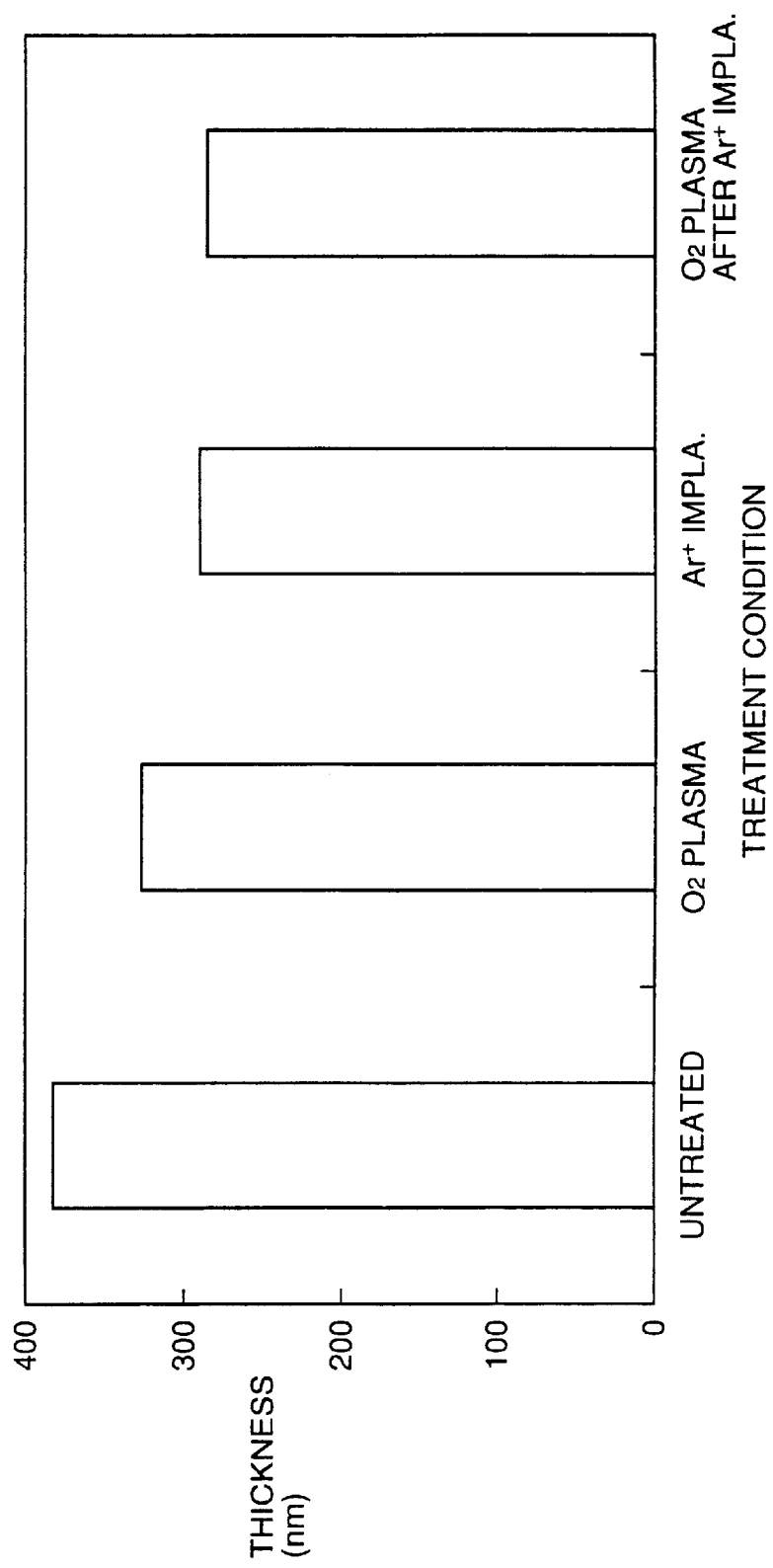

The modified SOG film is also superior in oxygen plasma resistance. FIG. 14 shows, as an index of oxygen plasma resistance, change in the film thickness when the modified SOG film formed by implanting argon ions into the organic SOG film is exposed to oxygen plasma for the evaluation of reduction in the film thickness of the modified SOG film. Ions were implanted under the conditions of an acceleration energy of 140 KeV and a dosage of $1\times10^{15}$ atoms/cm$^2$.

When the organic SOG film was subjected to oxygen plasma ($O_2$ PLASMA), the film thickness was reduced 16% than the initial film thickness of the organic SOG film (UNTREATED). When the modified SOG film was subjected to oxygen plasma ($O_2$ PLASMA AFTER Ar$^+$ IMPLA.), there was almost no reduction in the film thickness compared to that of the initial modified SOG film (Ar$^+$ IMPLA.). However, the film thickness of the modified SOG film is reduced 25% in comparison to that of the organic SOG film.

From the above results, it is appreciated that the modified SOG film is superior in oxygen plasma resistance. Furthermore, since reduction in the film thickness is greater when ions are implanted than the case where the film is exposed to oxygen plasma, it is considered that the film density is greater when ions are implanted.

The superior oxygen plasma resistance characteristic of the modified SOG film allows oxygen-based gas to be included as an etching gas to form via hole 9. This means that the range of selection of the types of etching gases can be increased. Also, oxygen-based gas of high ashing efficiency can be used in ashing the photoresist employed as an etching mask.

Figure 15:
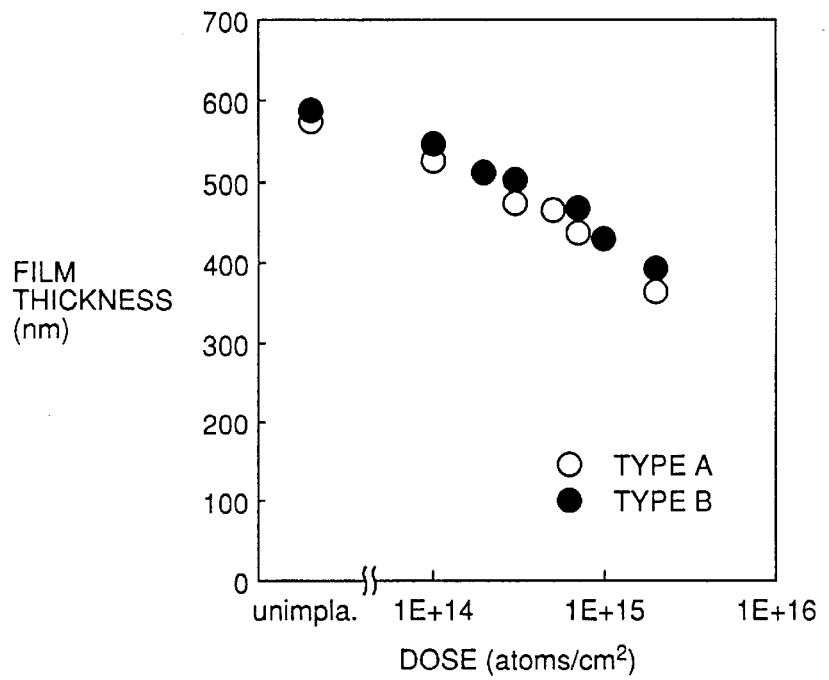

In association with this issue, FIG. 15 shows the relationship between the ion dosage and film thickness. Boron (B) ion was used and implanted at the acceleration energy of 140 KeV. The reduction in the film thickness was greater as the amount of the dose was increased, i.e., the film thickness becomes smaller. Therefore, it is considered that the density is greater in proportion to the dosage. In the experiment, two types were used as the organic SOG film. One was the siloxane type (referred to as type B hereinafter) organic SOG film corresponding to the above embodiment. The other was the methylsilsesquioxane type SOG film (referred to as type A hereinafter) with the component of $[(CH_3)_2Si_2O_3]_n$.

Figure 16:
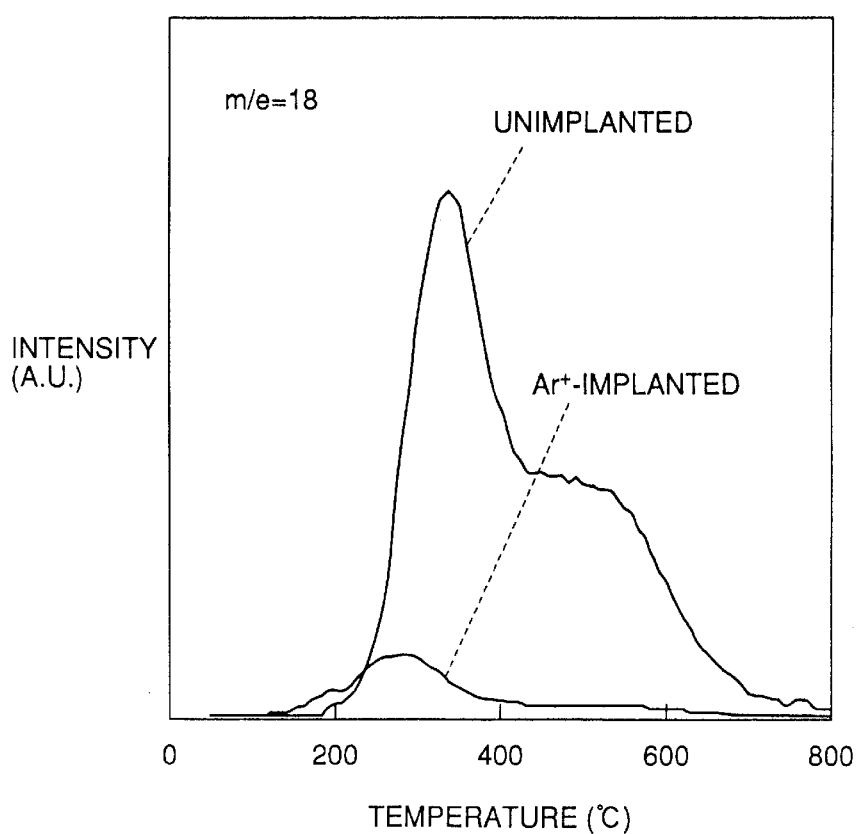

FIG. 16 shows the evaluation result by the TDS (Thermal Desorption Spectroscopy) of an organic SOG film (untreated: UNIMPLANTED) and a modified SOG film (ion implanted: Ar$^+$-IMPLANTED) subjected to heat treatment for 30 minutes in an atmosphere of nitrogen. Ions were implanted under the condition of an acceleration energy of 140 KeV and a dosage of $1\times10^{15}$ atoms/cm$^2$.

FIG. 16 represents the amount of desorption of $H_2O$ (m/e=18). It is appreciated from FIG. 16 that the desorption of $H_2O$ (m/e=18) for the modified SOG film 7 is small. This means that, by implanting ions into the organic SOG film to obtain the modified SOG film, the moisture and hydroxyl group included in the organic SOG film are reduced.

Figure 17:
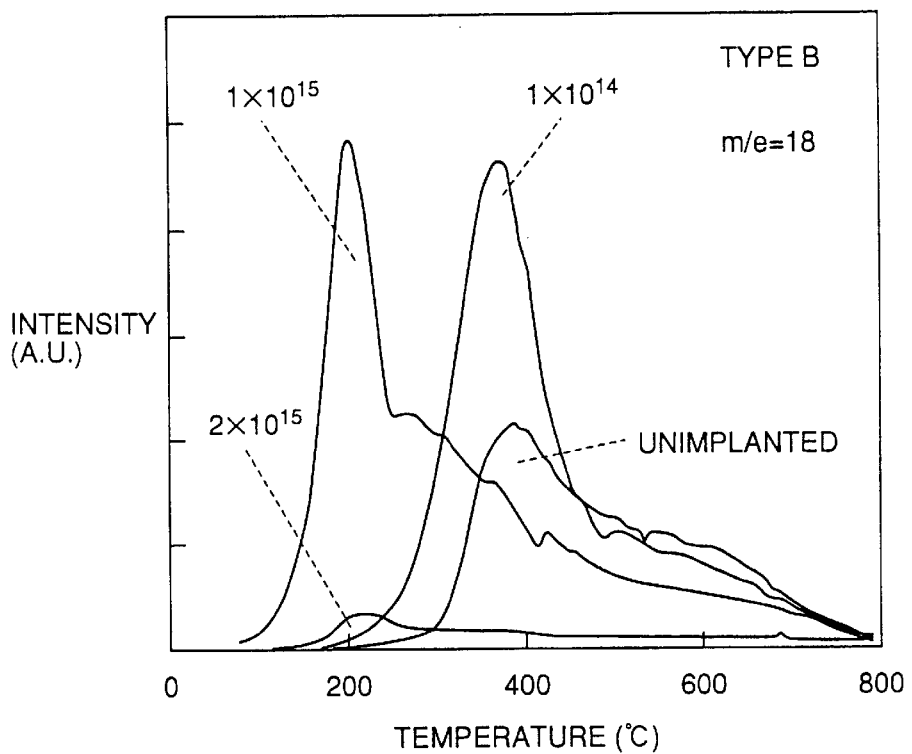
Figure 18:
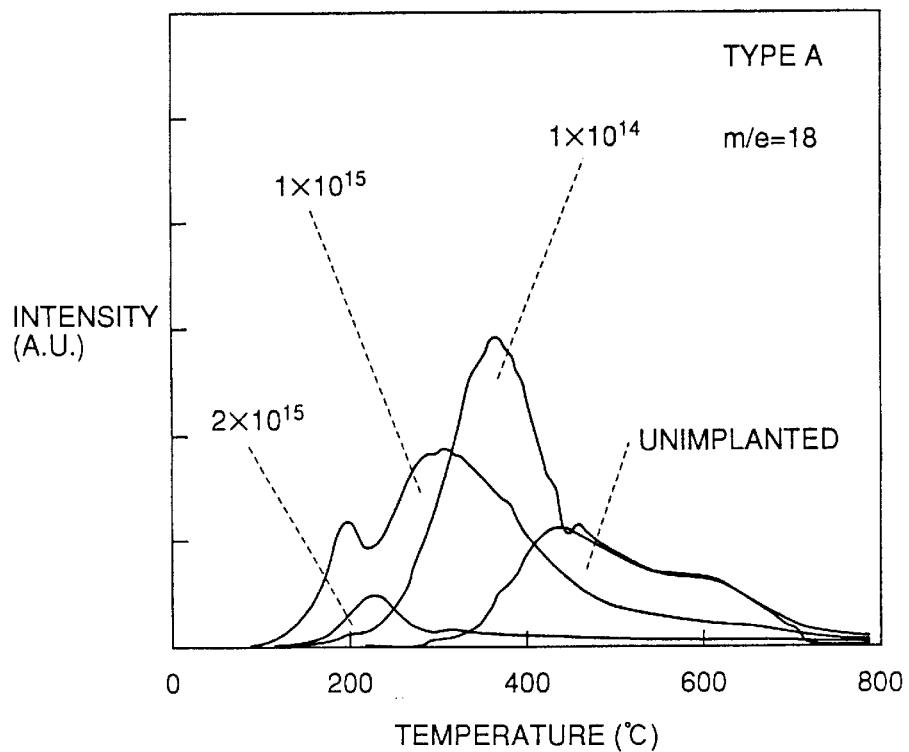

FIG. 17 shows the evaluation result by the TDS for an organic SOG film of type B (untreated: unimplanted) and a modified SOG film of type B implanted with boron ions (B$^+$) respectively subjected to a heat treatment for 30 minutes in a nitrogen atmosphere. The acceleration energy for ion implantation was 140 KeV. FIG. 18 shows the evaluation result for an organic SOG film of type A according to an experiment similar to that of FIG. 17. When boron ions are implanted with the dosage set to $2\times10^{15}$ atoms/cm$^2$, the moisture and hydroxyl group included in the organic SOG film can be reduced significantly. When the dosage is less than $1\times10^{15}$ atoms/cm$^2$, the amount of moisture shows an increase. However, it is recognized that the moisture can easily be desorbed at a lower temperature in comparison to those not implanted with ions.

Figure 19:
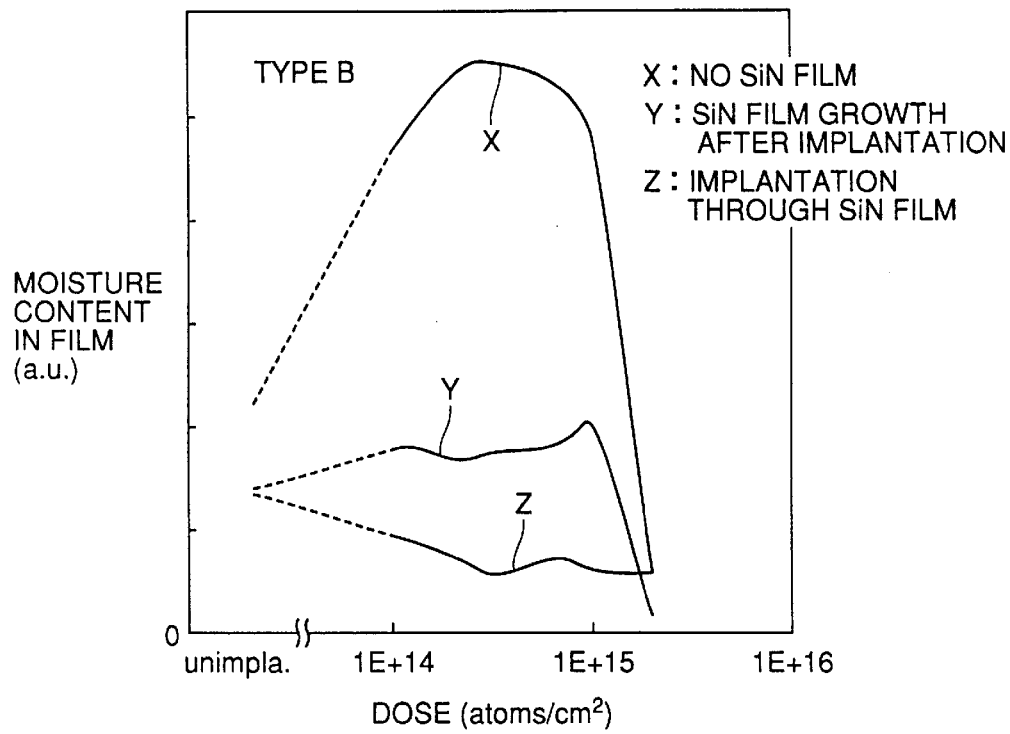

FIG. 19 shows the measured amount of moisture in a film with respect to the amount of ion implantation corresponding to the following cases for an organic SOG film of type B converted into a modified SOG film.

i) When modification is effected simply by implanting boron ions into an organic SOG film (NO SiN).

ii) When ions are implanted through a silicon nitride film as in the above embodiment (IMPLANTATION THROUGH SiN FILM).

iii) When a silicon nitride film is formed on the modified SOG film after ion implantation (SiN film growth after implantation).

The amount of moisture in the film was indexed on the basis of the integrated intensity of the O—H group in the infrared absorption spectrum (in the vicinity of 3500 cm$^{-1}$) using the FT-IR method (Fourier Transform Infrared Spectroscopy).

Figure 20:
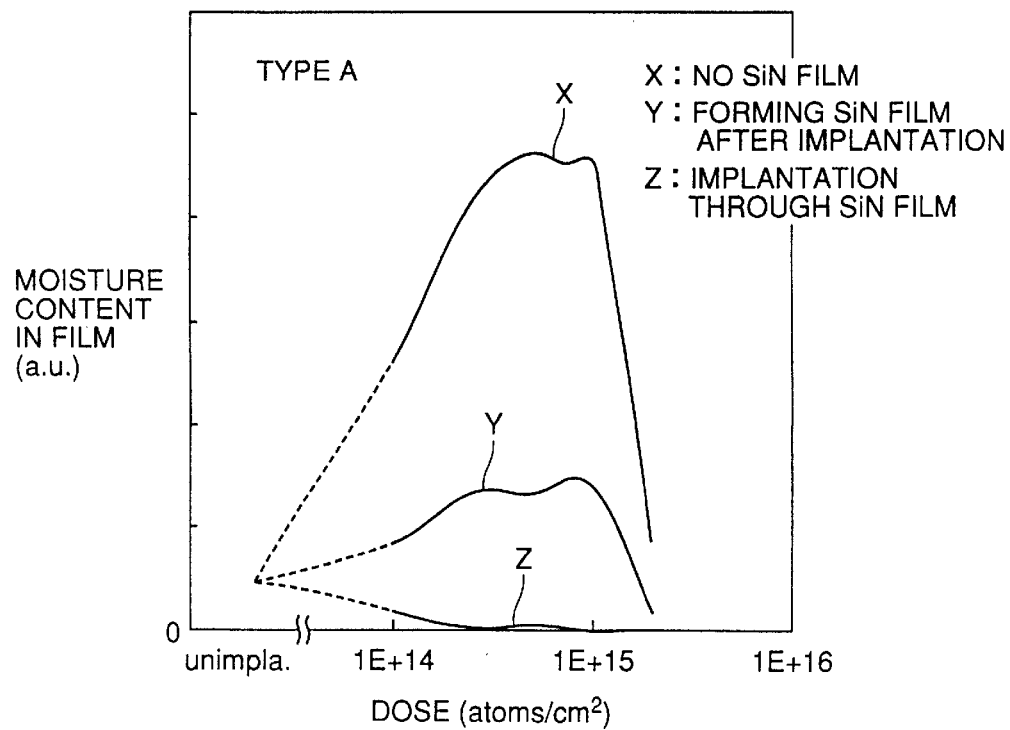

FIG. 20 shows the result for an organic SOG film of type A according to an experiment under conditions similar to that of FIG. 19. In FIGS. 19 and 20, the film thickness of respective organic SOG films and silicon nitride films are similar to those of the above embodiment.

In the case of "IMPLANTATION THROUGH SiN FILM" and "SiN FILM GROWTH AFTER IMPLANTATION", the containing amount of moisture is lower than the case of "NO SiN" irrespective of the dosage. It is therefore appreciated that favorable modified effect can be achieved even if the dosage is low. The amount of moisture in the film can be reduced significantly particularly in the case of "IMPLANTATION THROUGH SiN FILM" than in other cases.

This is considered to be attributed to the presence of the silicon nitride film serving to effectively prevent the moisture in the atmosphere of the clean room to be absorbed into the SOG film. Particularly in the case of IMPLANTATION THROUGH SiN FILM, it is recognized that the silicon nitride film containing ions exhibits superior water blocking effect. Even in the absence of the silicon nitride film, an organic SOG film of type B modified with the ion dosage of $1.4\times10^{15}$ atoms/cm$^2$ and an organic SOG film of type A modified with the ion dosage of $2.0\times10^{15}$ atoms/cm$^2$ can have the amount of moisture further reduced than the state where ions are not implanted without any particular heat treatment.

Figure 21:
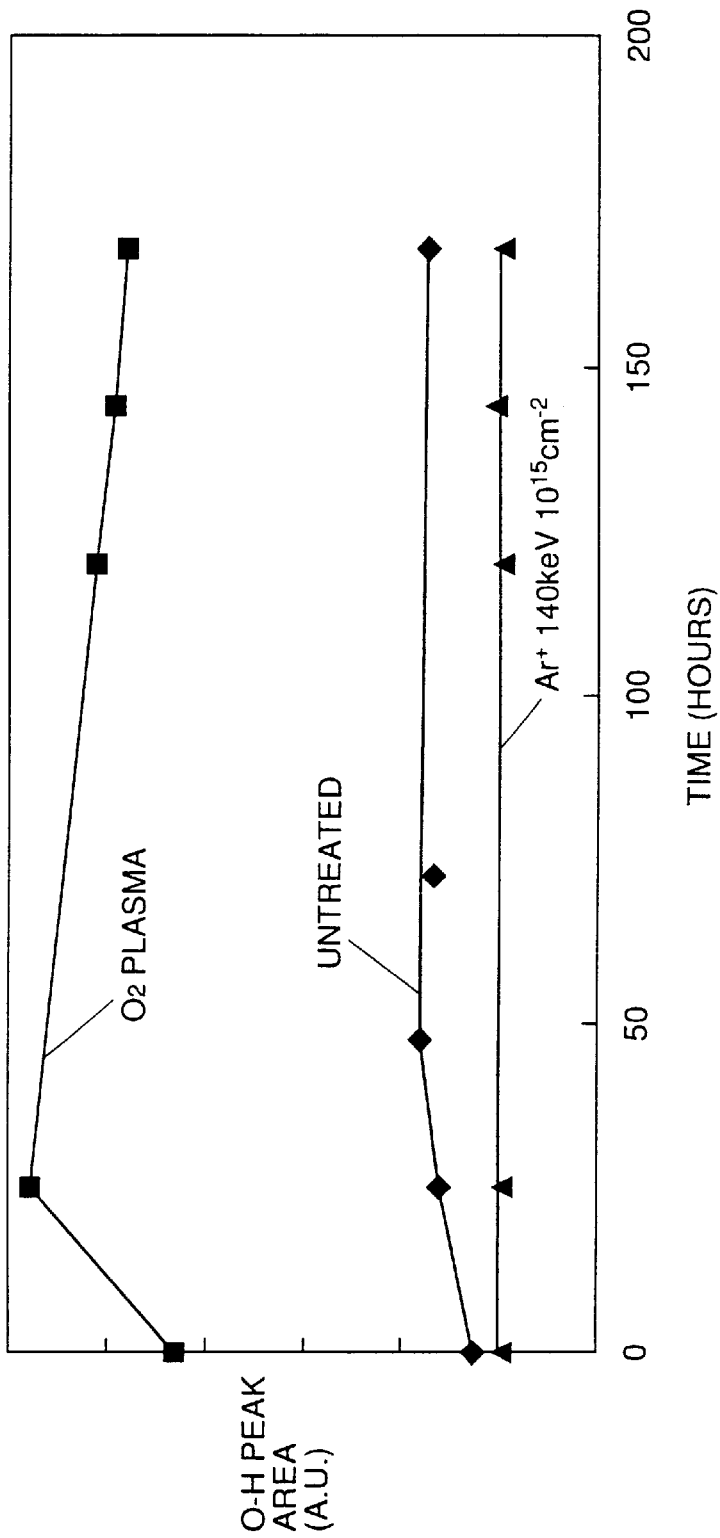

FIG. 21 shows the evaluation result of the moisture in the films of an organic SOG film (UNTREATED), an organic SOG film subjected to oxygen plasma ($O_2$ PLASMA), and a modified SOG film (Ar$^+$) left in the atmosphere in a clean room to observe the hygroscopicity of an organic SOG film and a modified SOG film. The amount of moisture in each film was indicated by the integrated intensity of the O—H group in the infrared absorption spectrum (in the vicinity of 3500 cm.$^{-1}$) using the FT-IR method (Fourier Transform Infrared Spectroscopy). Ion implantation was carried out under the conditions of an acceleration energy of 140 KeV and a dosage of $1\times10^{15}$ atoms/cm$^2$.

It is appreciated that the moisture increases, not only before and after the treatment, but also even after 1 day for the organic SOG film exposed to oxygen plasma. In contrast, the modified SOG film shows no increase in moisture after the ion implantation. Furthermore, the increase in moisture is smaller than that of the organic SOG film even when left in the atmosphere of a clean room. This means that the modified SOG film is less hygroscopic than the organic SOG film.

Figure 22:
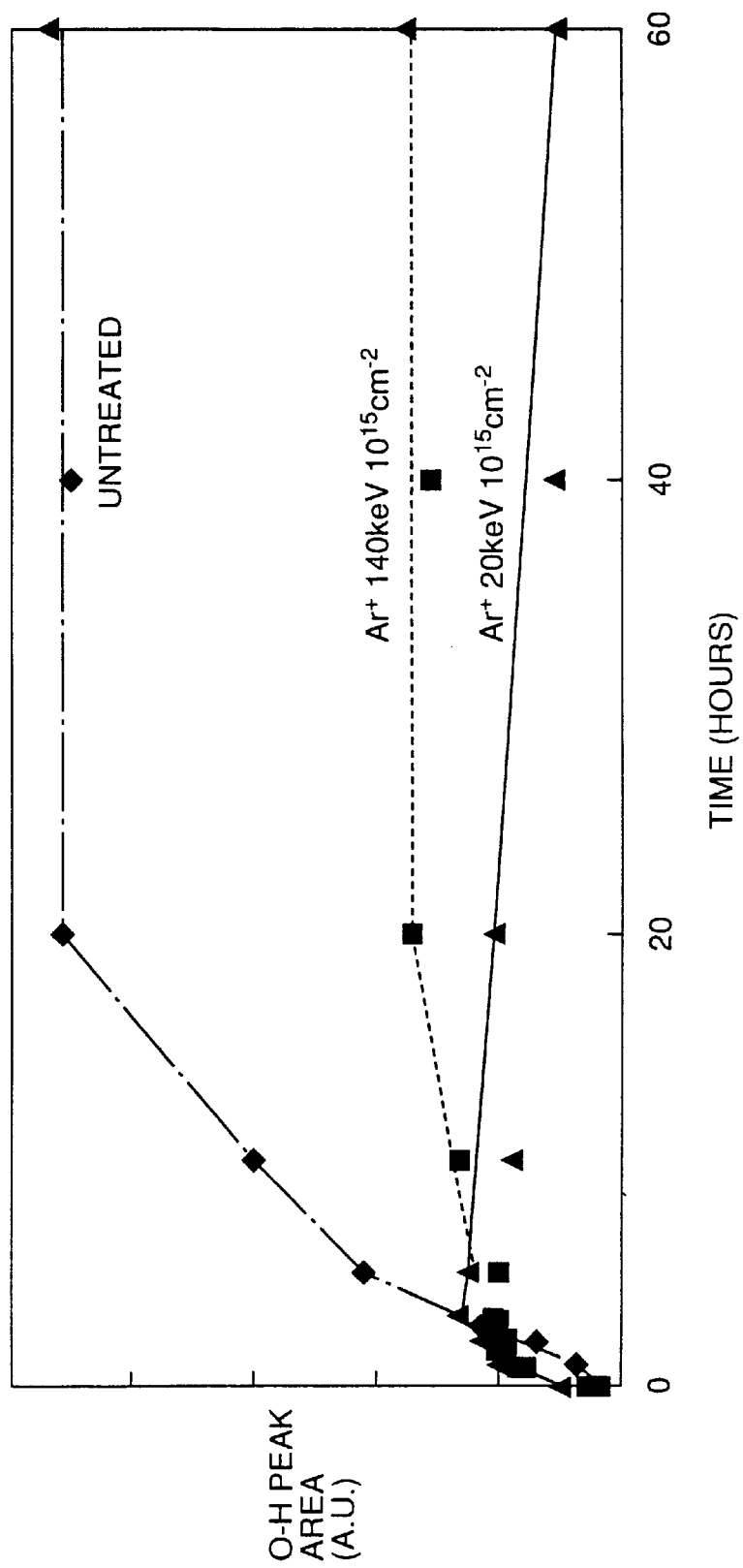

FIG. 22 shows the results of a pressure cooker test (PCT) carried out for the purpose of evaluating the moisture permeability of a modified SOG film and an organic SOG film. This PCT is a humidification test carried out in a saturated moisture ambient at 2 atmospheric pressure and 120° C. in the present embodiment. The integrated intensity of the absorption peak (in the vicinity of 3500 cm$^{-1}$) of the O—H group in the organic SOG film was obtained and plotted over the PCT time using the FT-IR method.

A specimen (Ar$^+$20 KeV) having only the surface modified by ion implantation was prepared and compared with a specimen having the film entirely modified (Ar$^+$140 KeV) and with a specimen that was not modified (organic SOG film: UNTREATED). When an organic SOG film not modified was subjected to the PCT, the absorption intensity (of the O—H group) in the vicinity of 3500 cm$^{-1}$ shows a significant increase. In the modified SOG film, the increase of the absorption intensity in the vicinity of 3500 cm$^{-1}$ (of the O—H group) is small. The increase in the specimen in which only the film surface is modified is substantially equal to that of the film that is completely modified.

It is understood from the above results that a layer that has moisture permeability suppressed can be formed by implanting ions.

Figure 23:
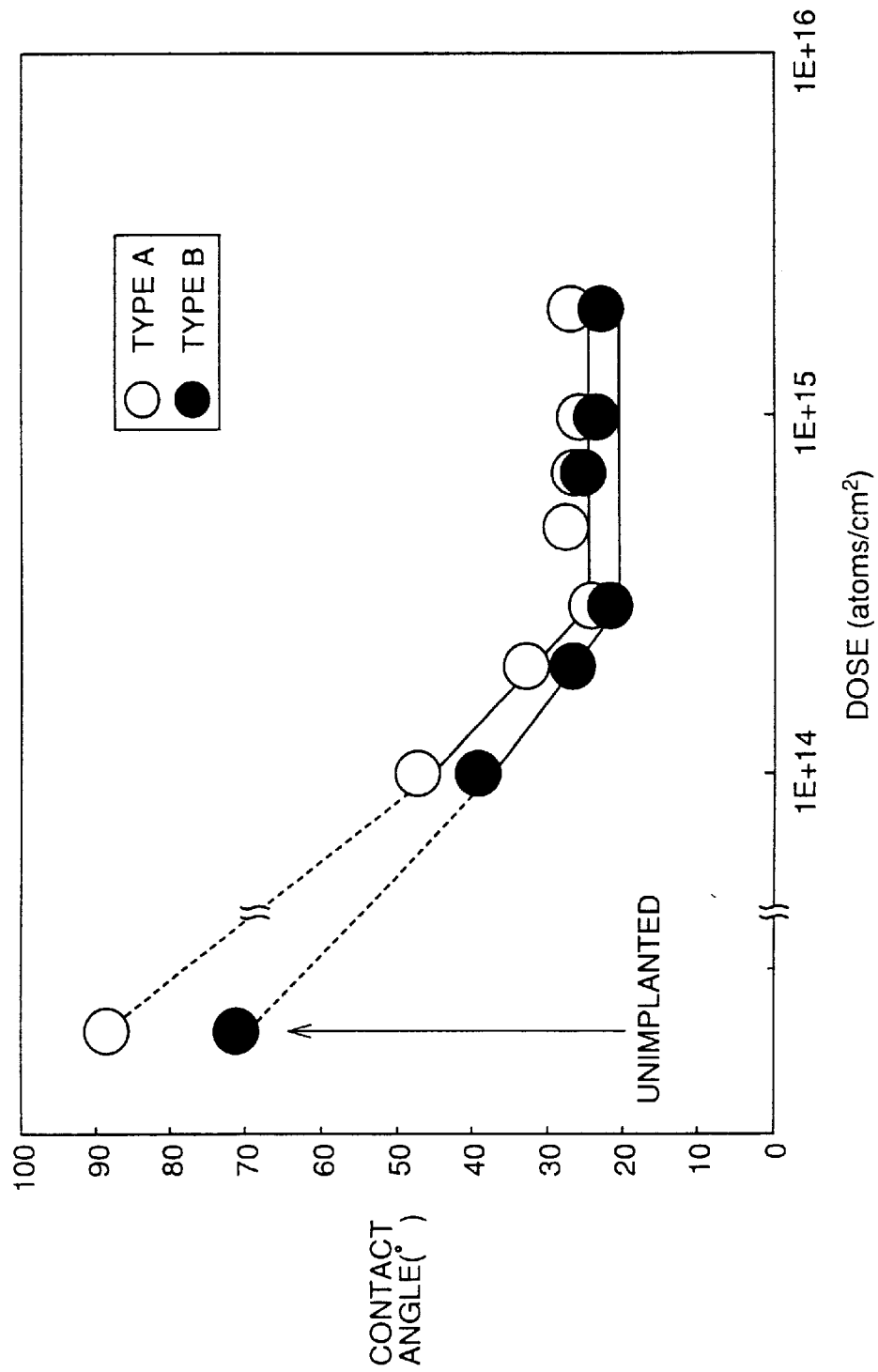
Figure 24:
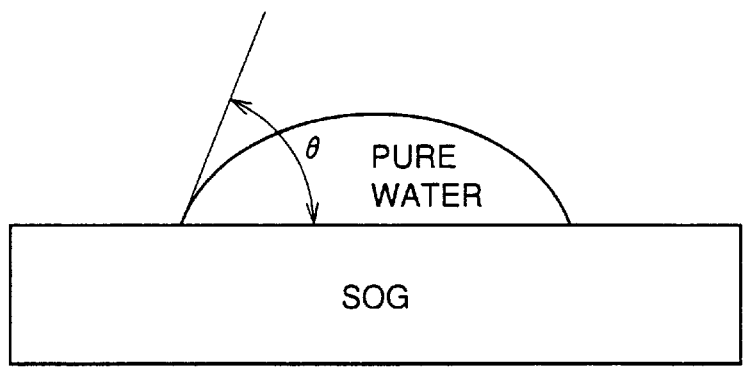

FIG. 23 shows the result of wettability of an organic SOG film (modified SOG film). The contact angle θ of a drop of pure water (having a resistivity of 18 MΩ·cm at 25° C.) on an organic SOG film was measured for the wettability of an organic SOG film. The contact angle implies the angle θ between the drop of pure water on the organic SOG film and the underlying film (SOG film) as shown in FIG. 24.

It is appreciated from FIG. 23 that the contact angle is stable at the level smaller than 30° by implanting boron ions. It is considered that, although the organic SOG film is poor in wettability since the containing amount of methyl group is great, the methyl group is decomposed by ion implantation to improve the wettability.

In the present embodiment, ions are implanted into organic SOG film 6(13) to modify the film by inclusion of impurities. The moisture and hydroxyl group included in the film are reduced and the film becomes less hygroscopic. Also, the adhesion of silicon oxide film 5(12) in contact with modified SOG film 7(14) is improved. An interlayer insulation film and passivation film superior in insulation characteristic and of high reliability can be obtained.

Second Embodiment

The second embodiment differs from the first embodiment only in the structure of the source.drain electrode (source.drain interconnection). In the second embodiment, only the relevant elements will be described.

The source.drain electrode of the second embodiment includes a TiN/Ti layered film beneath an aluminum alloy film as the so-called barrier metal, and a TiN/Ti layered film above the aluminum alloy film as an anti-reflection film (cap metal).

Figure 25:
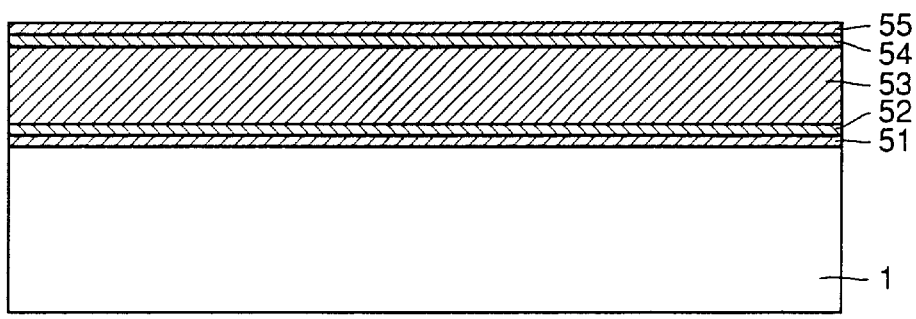
FIGS. 25–27 are sectional views of a semiconductor device for describing a fabrication process according to a second embodiment of the present invention.

A specific fabrication process will be described hereinafter. At a first step corresponding to the fabrication process of the first embodiment shown in FIG. 1, a Ti film 51 (film thickness 50 nm), a TiN film 52 (film thickness 100 nm), an aluminum alloy film (Al—Si (1%)—Cu (0.5%)) 53 (film thickness 500 nm), a Ti film 54 (film thickness 50 nm), and a TiN film 55 (film thickness 20 nm) are sequentially formed in this order by magnetron sputtering as shown in FIG. 25 for the purpose of forming a source.drain electrode.

Figure 26:
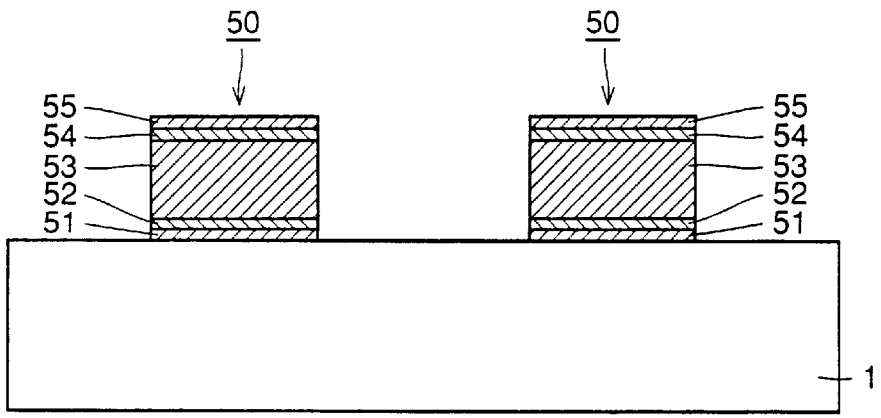

Referring to FIG. 26, these layered films are subjected to anisotropic etching to obtain a desired pattern. Thus, a source.drain electrode 50 is formed. It is to be noted that in FIGS. 25 and 26, gate oxide film 2, gate electrode 3, source.drain region 4, silicon oxide film 21 and contact hole 22 as shown in FIG. 1 are omitted.

Figure 27:
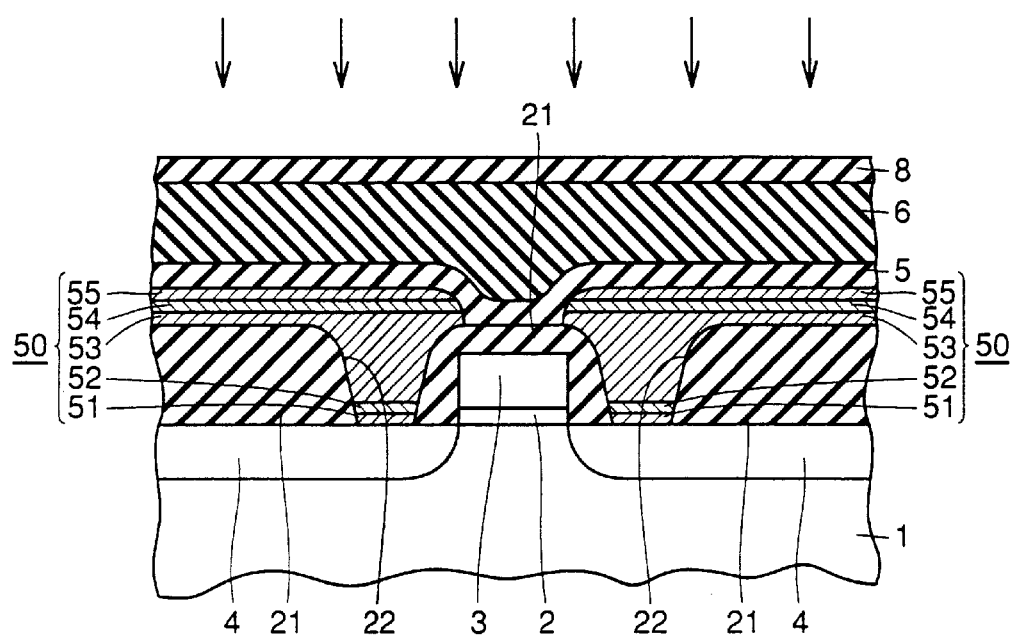

The fabrication process shown in FIG. 27 follows the fabrication step of FIG. 26. Similar to the third and fourth steps of the first embodiment, following the formation of silicon oxide film 5, organic SOG film 6 and silicon nitride film 8, boron ions are implanted into organic SOG film 6 through silicon nitride film 8 under the conditions of an acceleration energy of 140 KeV and a dosage of 2×10$^{15}$ atoms/cm$^2$.

By carrying out ion implantations under such conditions, boron ions arrive, not only at silicon oxide film 5, but also at Ti film 54. Since boron ions are introduced to Ti film 54, a TiB$_2$ compound phase is formed within Ti film 54, whereby the interconnection resistance is reduced.

The following Table 2 shows the resistivity of various Ti based metals. It is appreciated from Table 2 that TiB$_2$ has a resistivity extremely lower than that of the other metals.

TABLE 2

|  | TiB$_2$ | Ti | TiN | TiC |
|---|---|---|---|---|
| Resistivity (μΩ·cm) | 25 | 70 | 100 | 150 |

According to the second embodiment of the present invention, the interconnection resistance can be reduced by introducing impurities (boron: B) into Ti film 54 in addition to the advantage of the first embodiment. Therefore, the thickness of Ti film 54 itself can be made thinner. This means that the entire source.drain electrode 50 can be reduced in thickness. In this case, the characteristics of the contact resistance and electromigration resistance are equal to those of a Ti film into which ions are not introduced.

Thus, microfabrication and the integration density of a semiconductor device can be improved. AlMo, the present invention contributes to speeding the element operation since the parasitic capacitance between the interconnections can be reduced by virtue of a thinner interconnection layer.

Data supporting the advantage of the above first and second embodiments are shown in FIGS. 28–34.

Figure 28:
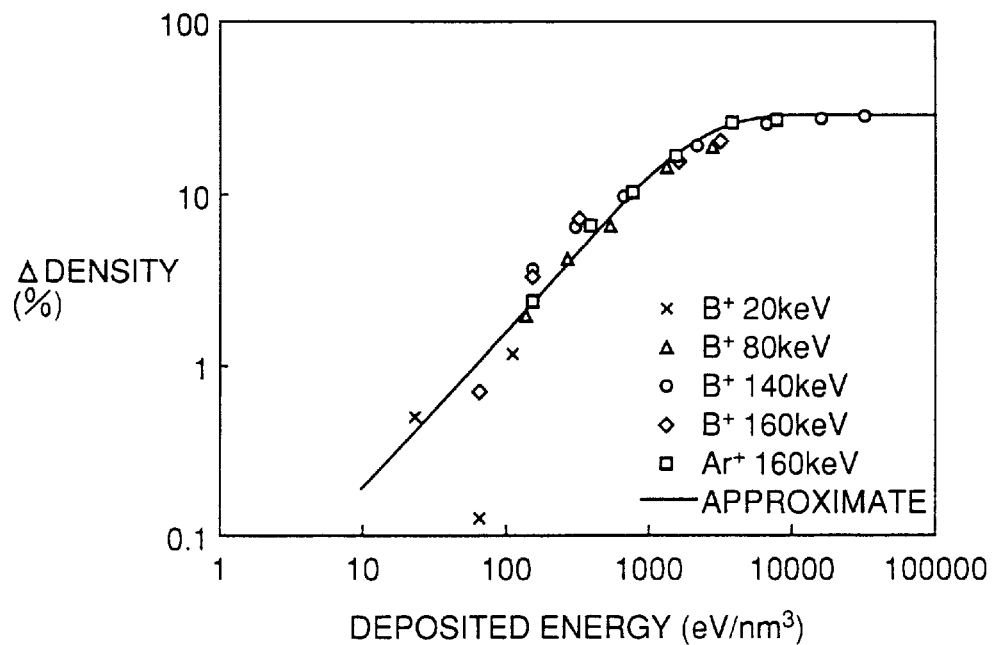
FIGS. 28–34 are diagrams of characteristics for describing an embodiment of the present invention.

FIG. 28 shows the relationship between the increasing rate of density (Δ DENSITY) of a film when ions (B or Ar) are implanted into an organic SOG film and the total deposited energy by ion-implantation (DEPOSITED ENERGY). It is appreciated from FIG. 28 that the increasing rate of the density of the film increases in proportion to increase of the total deposited energy. Saturation is achieved when the total deposited energy exceeds 1×10$^4$ eV/nm$^3$. This relationship does not substantially change even when the acceleration energy or type of ion differs.

Figure 29:
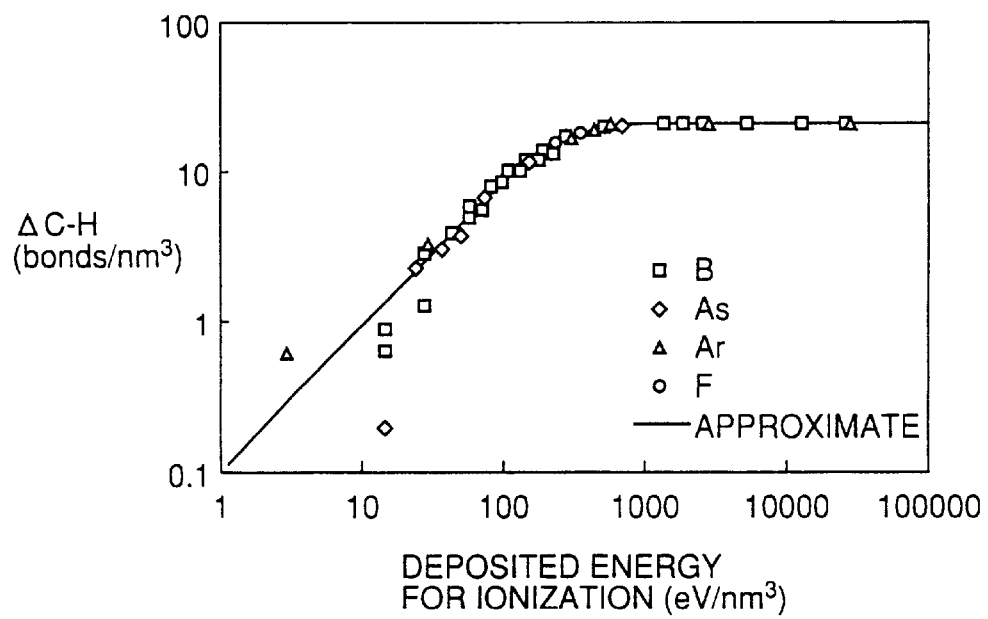

FIG. 29 shows the relationship between the amount of decomposition of the C—H group (ΔC—H) in the film when various ions (B, As, Ar or F) are implanted into an organic SOG film and the ionization (related to electronic stopping power) of the total deposited energy by ion implantation (DEPOSITED ENERGY FOR IONIZATION). It is appreciated from FIG. 29 that the amount of decomposition of the C—H group increases in proportion to the increase of the deposited energy. Saturation is achieved when the deposited energy exceeds 1×10$^3$ eV/nm$^3$. This relationship shows almost no change even when the type of ions differ.

Figure 30:
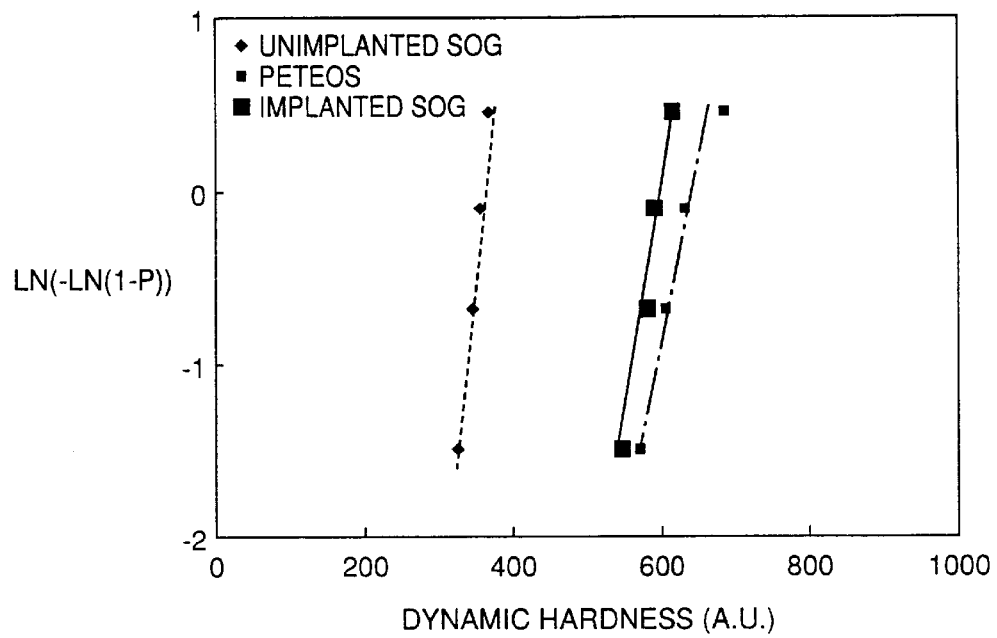

FIG. 30 shows the relationship between the LN (–LN(1–P)) and the hardness of the film (DYNAMIC HARDNESS)

of the cumulative frequency of the measurement points when boron ions are implanted into the organic SOG film. Referring to FIG. 30, the film implanted with ions (IMPLANTED SOG: solid line in drawing) has a hardness substantially equal to that of a silicon oxide film formed by plasma CVD (PETEOS: chain dotted line in drawing) in comparison to a film not subjected to ion implantation (UNIMPLANTED SOG: dotted line in drawing).

Figure 31:
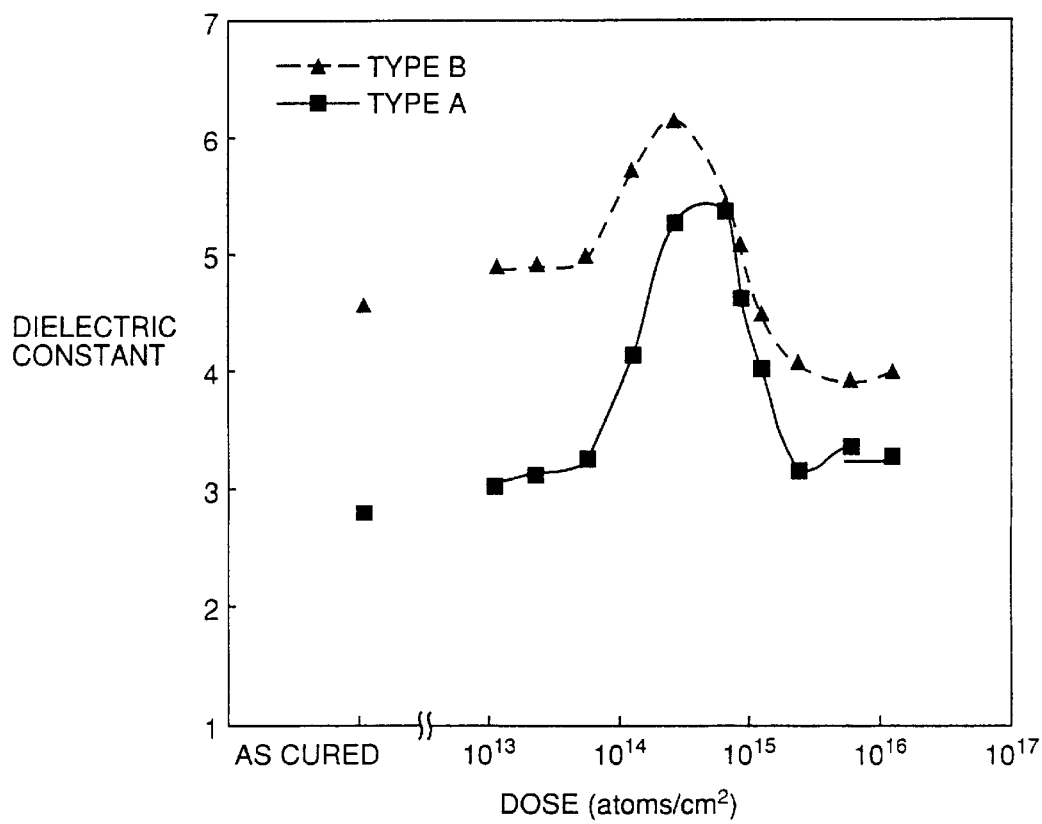

FIG. 31 shows the relationship between the dielectric constant and the amount of dose when boron ions are implanted into an organic SOG film (film thickness 600 nm) formed on a silicon substrate. The following issues were observed.

(a) The dielectric constant was lower for type A than type B irrespective to the amount of dose of the ion.

(b) The dielectric constant for type A and type B both exhibited a peak when the dose was approximately $3 \times 10^{14}$ atoms/cm$^2$. In regions thereunder, the dielectric constant increases in proportion to a greater dose. In higher regions, the dielectric constant decreases in proportion to the increase of the dose. The dielectric constant exhibited saturation at the dosage of approximately $2 \times 10^{15}$ atoms/cm$^2$.

(c) By implanting boron ions at the dose of approximately $2 \times 10^{15}$ atoms/cm$^2$ into type A, a film of extremely low dielectric constant ($\in = 3.2$) can be obtained.

Figure 32:
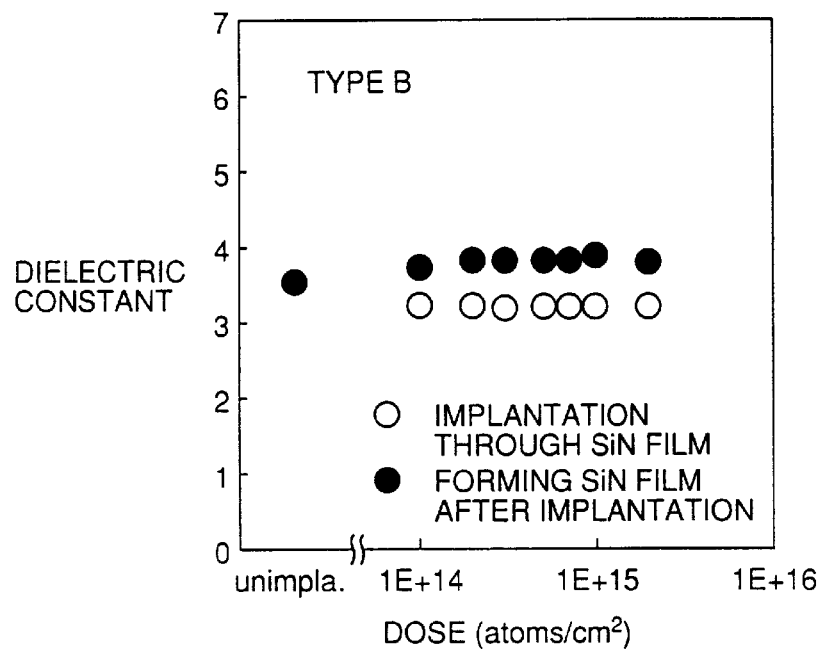
Figure 33:
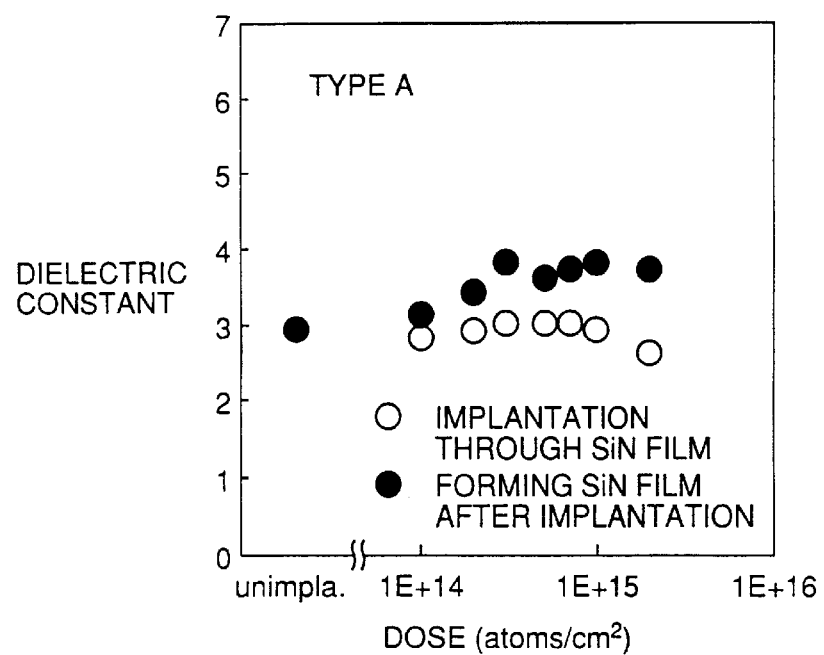

FIG. 32 shows the relationship between the dielectric constant and the amount of dose for a film obtained by modifying an organic SOG film (film thickness 600 nm) of type B corresponding to the cases where boron ions are implanted through a silicon nitride film (IMPLANTATION THROUGH SiN), and forming a silicon nitride film on a modified SOG film after ions are implanted (SiN film growth after implantation). FIG. 33 shows the result for an organic SOG film of type A according to an experiment carried out under the conditions similar to those of FIG. 32.

The results of FIGS. 31–33 show that there is a definite correspondence between the amount of moisture in the organic SOG film and the dielectric constant of the film. More specifically, the amount of moisture in the organic SOG film for the case of "NO SiN" in FIGS. 19 and 20 is greatest when the dose is approximately $3 \times 10^{14}$ atoms/cm$^2$. This corresponds to the peak value of FIG. 31. When the dose is set to approximately $2 \times 10^{15}$ atoms/cm$^2$ for the case of "NO SiN" of FIGS. 19 and 20, the amount of moisture in the film becomes lower than the detectable limit. This corresponds to FIG. 31. For the cases of "IMPLANTATION THROUGH SiN FILM" and "SiN film growth after implantation", the amount of moisture in the organic SOG film of FIGS. 19 and 20 is analogous to the characteristic of the dielectric constant of FIGS. 32 and 33.

In other words, the amount of moisture in the organic SOG film is greatly related to the dielectric constant in the film. Since the amount of moisture is extremely low in the above films such as the modified SOG film formed on a silicon nitride film as in the above embodiment, the organic SOG film of type B modified with the dose of $1.4 \times 10^{15}$ atoms/cm$^2$ without a silicon nitride film, and the organic SOG film of type A modified at the dose of $2.0 \times 10^{15}$ atoms/cm$^2$, the dielectric constant is also extremely low. When the interconnection is covered with this modified SOG film, the parasitic capacitance between the interconnections becomes extremely low, so that the problem of signal delay caused by parasitic capacitance can be solved significantly.

Figure 34:
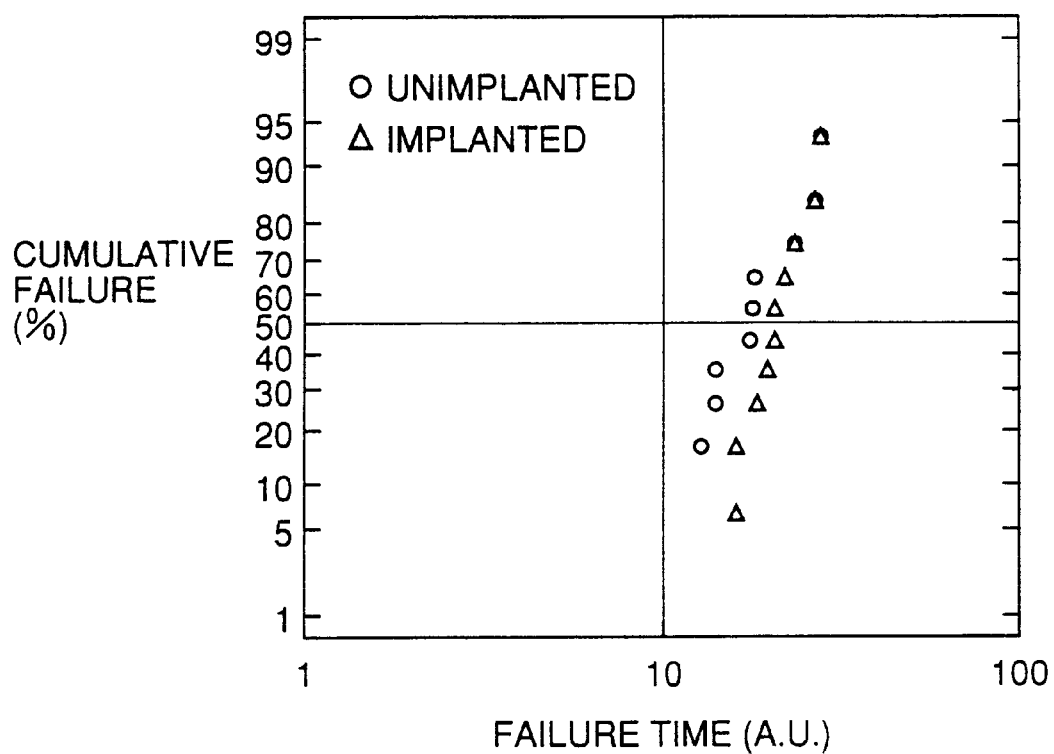

FIG. 34 shows the relationship between the cumulative failure of a Ti film and the time before disconnection (FAILURE TIME) as an index of evaluating the electromigration resistance of the Ti film when boron ions are implanted into the Ti film through an organic SOG film such as a film in the second embodiment. It is appreciated from FIG. 34 that the film implanted with ions (IMPLANTED) maintain characteristics equal to those of a film not subjected to ion implantation (UNIMPLANTED).

The present invention is not limited to the above embodiment, and similar advantages can be achieved by implementation as set forth in the following.

(1) Polyimide or polyimide composed with siloxane can be used instead of organic SOG films 6 and 13.

(2) A silicon oxide film formed by a method other than plasma CVD can be used for silicon oxide films 5 and 12. For example, atmospheric CVD, low pressure CVD, ECR plasma CVD, photoexcitation CVD, TEOS-CVD, and PVD can be used. When the atmospheric pressure CVD method is used, the gas employed is monosilane and oxygen ($SiH_4+O_2$). The film growth temperature thereof is not more than 400° C. The gas used for low pressure CVD is monosilane and nitrous oxide ($SiH_4+N_2O$). The film growth temperature thereof is not more than 900° C.

(3) Silicon nitride films 8 and 15 can be formed by a method other than by plasma CVD (such as atmospheric CVD, low pressure CVD, high density plasma enhanced CVD, photoexitation CVD, PVD and the like). The gas used in the atmospheric pressure CVD method is monosilane and ammonia ($SiH_4+NH_3$). The film growth temperature is less than 900° C. When low pressure CVD is employed, the gas that can be used is similar to that for the atmospheric CVD method. The film growth temperature is less than 800° C.

(4) As an alternative of silicon nitride films 8 and 15, a film (for example, a silicon oxide nitride film) corresponding to silicon nitride films 8 and 15 can be formed by applying a plasma process on each surface layer of organic SOG films 6 and 13 in an atmosphere of nitrogen or nitrogen compound ($N_2$, NO, $N_2O$, $NO_2$, $NH_3$ and the like).

(5) As an alternative to silicon nitride films 8 and 15, a silicon oxide film formed by plasma CVD can be used. The method forming this silicon oxide film is similar to that of silicon oxide film 5.

(6) As an alternative of silicon nitride films 8 and 15, a metal film such as a TiN film, Ti film, TaN film, TiW film and the like formed by magnetron sputtering or CVD can be used.

(7) Silicon oxide films 5 and 12 can be replaced with another insulation film (such as silicon nitride film and silicate glass film) having a high mechanical strength in addition to the property of blocking moisture and the hydroxyl group. This insulation film can be formed by an arbitrary method such as CVD and PVD.

(8) Source.drain electrode 10, upper metal interconnection 23, and aluminum alloy film 53 can be formed of a conductive material other than aluminum (such as copper, gold, silver, silicide, refractory metal, doped polysilicon, tantalum nitride (TaN), titanium nitride (TiN) and titanium tungsten (TiW)), and stacked layers thereof.

(9) Modified SOG films 7 and 14 can be subjected to heat treatment. In this case, the number of dangling bonds in modified SOG films 7 and 14 becomes smaller, so that the hygroscopicity and moisture permeability are further reduced.

(10) The composition of organic SOG films 6 and 13 can be substituted with that represented by the aforementioned general formula (2).

(11) The composition of organic SOG films 6 and 13 can be substituted with that represented by the aforementioned general formula (1), with ions implanted into the inorganic SOG film. In this case, the amount of moisture and hydroxyl group included in the inorganic SOG film can be reduced.

(12) Although boron ions are employed as impurities introduced into organic SOG films 6 and 13 in the above embodiments, any ion may be used as long as organic SOG films 6 and 13 can be modified.

Specifically, argon ions, boron ions, nitrogen ions and the like that have a relatively small mass are suitable. Particularly, boron ions are most suitable. Sufficient effect can be expected from other ions enumerated in the following.

Inert gas ions other than argon (such as helium ion, neon ion, krypton ion, xenon ion and radon ion) can be used. Since inert gas does not react with an organic SOG film, there is no probability of advert influence by ion implantation.

Element unitary ions in each group of the periodic table of IIIb, IVb, Vb, VIb, and VIIb other than boron and nitrogen, and compound ions thereof can be used. Particularly, the element unitary ions and compound ions of oxygen, aluminum, sulfur, chlorine, gallium, germanium, arsenic, selenium, bromine, antimony, iodine, indium, tin, tellurium, lead, and bismuth can be preferably used.

Also, element unitary ions of the groups IVa, Va and compound ions thereof can be used. Particularly, element unitary ions of titanium, vanadium, niobium, hafnium, and tantalum and compound ions thereof are preferable. Since the dielectric constant of the oxide of the element of the groups IVa and Va is high, the dielectric constant of the organic SOG film subjected to ion implantation increases. However, this is of no particular problem in practice except for the case where an interlayer insulation film of a low dielectric constant is required.

A plurality of the types of the above-described ions can be used in combination. In this case, a further superior effect can be obtained by the synergism of each ion.

(13) In the above-described embodiments, ions are implanted into organic SOG films 6 and 13. The present invention is not limited to ions, and atoms, molecules, or particles can be introduced. In the present invention, these are generically referred to as "impurities".

(14) Sputtering is not limited to magnetron sputtering. Diode sputtering, radio frequency sputtering, tetrode sputtering and the like can be employed.

(15) The sputter etching method can be carried out without using inert gas. For example, reactive ion beam etching (RIBE: also called reactive ion milling) using reactive gas (for example, $CCl_4$, $SF_6$) can be employed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A fabrication method of a semiconductor device comprising the steps of:
   forming a first insulation film on a substrate,
   forming a cap film on said first insulation film having a water resistance better than the water resistance of said first insulation film, and
   introducing impurities into said first insulation film,
   wherein said introduction of impurities into said first insulation film is carried out through said cap film after said cap film is formed.

2. The fabrication method of a semiconductor device according to claim 1, further comprising the step of forming a lower insulation film on the substrate prior to formation of said first insulation film,
   wherein said introduction of impurities into said first insulation film is carried out under a condition where introduced impurities arrive at an interface between said first insulation film and said lower insulation film.

3. The fabrication method of a semiconductor device according to claim 1, further comprising the step of forming a metal interconnection layer on the substrate, prior to formation of said first insulation film, wherein said introduction of impurities into said first insulation film is carried out under a condition where introduced impurities arrive at said metal interconnection layer.

4. The fabrication method of a semiconductor device according to claim 1, further comprising the step of forming a metal interconnection layer on the substrate, and forming a lower insulation film on the metal interconnection layer, prior to formation of said first insulation film,
   wherein said introduction of impurities into said first insulation film is carried out under a condition where introduced impurities arrive at said metal interconnection layer.

5. The fabrication method of a semiconductor device according to claim 1, wherein said first insulation film comprises a silicon oxide film containing at least 1% of carbon atoms.

6. The fabrication method of a semiconductor device according to claim 1, wherein said first insulation film comprises an inorganic SOG film.

7. The fabrication method of a semiconductor device according to claim 1, wherein said cap film comprises a silicon nitride type material.

8. The fabrication method of a semiconductor device according to claim 1, wherein said cap film is formed by applying a plasma process on a surface layer of said first insulation film in an atmosphere of nitrogen or nitrogen compound.

9. The fabrication method of a semiconductor device according to claim 1, wherein said cap film comprises a silicon oxide film formed by plasma CVD.

10. The fabrication method of a semiconductor device according to claim 1, wherein said cap film comprises a metal film.

11. The fabrication method of a semiconductor device according to claim 1, wherein said impurities are one of boron ions and argon ions.

12. The fabrication method of a semiconductor device according to claim 2, wherein said introduction of impurities into said first insulation film is carried out under a condition where the number of impurities per unit area passing through a bottom plane of said first insulation film is at least $2 \times 10^{13}$ atoms/cm$^2$.

13. The fabrication method of a semiconductor device according to claim 2, wherein said introduction of impurities into said first insulation film is carried out under a condition where the number of impurities per unit area passing through a bottom plane of said first insulation film is $2 \times 10^{18}$ atoms/cm$^2$.

14. The fabrication method of a semiconductor device according to claim 1, wherein said impurities are introduced by ion implantation.

15. The fabrication method of a semiconductor device according to claim 1, comprising the step of carrying out heat treatment after said introduction of impurities.

* * * * *